(12) United States Patent
Lee et al.

(10) Patent No.: US 12,225,792 B2
(45) Date of Patent: Feb. 11, 2025

(54) DISPLAY DEVICE

(71) Applicant: SAMSUNG DISPLAY CO., LTD., Yongin-si (KR)

(72) Inventors: Minku Lee, Yongin-si (KR); Chulkyu Kang, Yongin-si (KR); Jaesic Lee, Yongin-si (KR); Seonkyoon Mok, Yongin-si (KR); Dongsun Lee, Yongin-si (KR); Soyoung Lee, Yongin-si (KR); Haijung In, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/301,982

(22) Filed: Apr. 17, 2023

(65) Prior Publication Data

US 2023/0263023 A1    Aug. 17, 2023

Related U.S. Application Data

(63) Continuation of application No. 17/085,933, filed on Oct. 30, 2020, now Pat. No. 11,631,729.

(30) Foreign Application Priority Data

May 8, 2020    (KR) .................. 10-2020-0055303

(51) Int. Cl.
*H10K 59/131*    (2023.01)
(52) U.S. Cl.
CPC .................... *H10K 59/131* (2023.02)

(58) Field of Classification Search
None
See application file for complete search history.

(56) References Cited

U.S. PATENT DOCUMENTS

| | | | |
|---|---|---|---|
| 6,667,783 B2 | 12/2003 | Greene et al. | |
| 7,414,599 B2 | 8/2008 | Chung et al. | |
| 10,049,635 B2 | 8/2018 | Kawamura et al. | |
| 2017/0288002 A1* | 10/2017 | Kim ................ | H10K 77/111 |
| 2018/0204895 A1 | 7/2018 | Lin et al. | |
| 2019/0051249 A1 | 2/2019 | Nie et al. | |
| 2019/0057658 A1* | 2/2019 | Nie .................. | G09G 3/3266 |
| 2020/0075640 A1* | 3/2020 | Song ................ | H01L 27/1288 |
| 2021/0098494 A1* | 4/2021 | Feng ................ | H01L 27/124 |

FOREIGN PATENT DOCUMENTS

| | | |
|---|---|---|
| KR | 10-0560780 B1 | 3/2006 |
| KR | 10-2015-0078593 A | 7/2015 |

\* cited by examiner

*Primary Examiner* — Nicholas J Lee
(74) *Attorney, Agent, or Firm* — Lewis Roca Rothgerber Christie LLP

(57) ABSTRACT

A display device includes: a substrate including a display area, a peripheral area outside the display area, and a pad area in the peripheral area; a data line in the display area; and a first connection line in the display area and connected to the data line to transmit, to the data line, a signal from the pad area, wherein the first connection line includes a first portion in a first direction and a second portion bent from the first portion and in a second direction.

23 Claims, 28 Drawing Sheets

DISPLAY DEVICE

CROSS-REFERENCE TO RELATED APPLICATIONS

This application is a continuation of U.S. patent application Ser. No. 17/085,933, filed Oct. 30, 2020, which claims priority to and the benefit of Korean Patent Application No. 10-2020-0055303, filed May 8, 2020, the entire content of both of which is incorporated herein by reference.

BACKGROUND

1. Field

Aspects of one or more example embodiments relate to a display device.

2. Description of Related Art

With the rapid development of display technologies that visually display various pieces of electrical signal information, various display devices having excellent characteristics, such as relatively reduced thickness, relatively lighter weight, and relatively lower power consumption, compared to alternative technologies, have been introduced. In addition, physical buttons or the like may be removed from the front surface of a display device, and thus decreasing a dead area of the display device and increasing the area of a display area.

The above information disclosed in this Background section is only for enhancement of understanding of the background and therefore the information discussed in this Background section does not necessarily constitute prior art.

SUMMARY

Aspects of one or more example embodiments include a display device having a reduced dead area and capable of stably transmitting a data signal to pixels without an increase in manufacturing cost.

Additional aspects will be set forth in part in the description which follows and, in part, will be more apparent from the following description, or may be learned by practice of the presented example embodiments of the disclosure.

According to one or more embodiments, a display device includes a substrate including a display area, a peripheral area outside the display area, and a pad area in the peripheral area, a data line arranged in the display area, and a first connection line arranged in the display area and connected to the data line to transmit, to the data line, a signal from the pad area, wherein the first connection line includes a first portion arranged in a first direction and a second portion bent from the first portion and arranged in a second direction.

According to some example embodiments, the first direction and the second direction may be perpendicular to each other.

According to some example embodiments, the first direction may be parallel to a lengthwise direction of a scan line arranged in the display area.

According to some example embodiments, the second direction may be parallel to a lengthwise direction of the data line.

According to some example embodiments, the data line and the first portion may be arranged on different layers.

According to some example embodiments, the first portion and the second portion may be arranged on different layers.

According to some example embodiments, the first portion and the second portion may be arranged on the same layer.

According to some example embodiments, at least one of the first portion and/or the second portion may extend in a straight line.

According to some example embodiments, at least a portion of the first connection line may be arranged to overlap at least one of a scan line and/or a pixel electrode on a plane.

According to some example embodiments, the display device may further include a second connection line arranged in the peripheral area, connected to the first connection line, and located in the pad area.

According to some example embodiments, the display area may include a plurality of pixel areas arranged in rows and columns, and one scan line passing through pixel areas arranged in the same column among the plurality of pixel areas may intersect with the first connection line once or twice on a plane.

According to some example embodiments, a distance from a portion of the first connection line, which is connected to the pad area, to the pad area may be different from a distance from the pad area to a portion of the first connection line, which is connected to the data line.

According to some example embodiments, a point of the first connection line, which has a maximum distance from the pad area to the first connection line, may be arranged between a portion of the first connection line, which is connected to the pad area, and a portion of the first connection line, which is connected to the data line.

According to some example embodiments, a corner of an edge of the display area may be round.

According to some example embodiments, the data line may be arranged as a plurality of data lines to be spaced apart from each other in the display area, the first portion may overlap at least one of the plurality of data lines on a plane, and the first portion may not overlap the rest of the plurality of data lines except for the data lines overlapping on a plane.

According to some example embodiments, a display device includes a substrate including a display area, a peripheral area outside the display area, and a pad area in the peripheral area, a first data line arranged in the display area, a first connection line arranged in the display area and connected to the first data line to transmit, to the first data line, a signal from the pad area, a plurality of second data lines arranged in the display area and each extending in a second direction, and a third connection line arranged in the peripheral area and having one end connected to one of the second data lines and the other end located in the pad area, wherein the first connection line includes a first portion arranged in a first direction and a second portion bent from the first portion and arranged in the second direction.

According to some example embodiments, the first direction and the second direction may be perpendicular to each other.

According to some example embodiments, the first direction may be parallel to a lengthwise direction of a scan line arranged in the display area, or the second direction may be parallel to a lengthwise direction of the first data line.

According to some example embodiments, at least one of the first data line and/or the second data line may be arranged on a different layer from at least one of the first portion and/or the second portion.

According to some example embodiments, the first portion and the second portion may be arranged on different layers or on the same layer.

According to some example embodiments, at least a portion of the first connection line may be arranged to overlap at least one of a scan line and/or a pixel electrode on a plane.

According to some example embodiments, a distance from a portion of the first connection line, which is connected to the pad area, to the pad area may be different from a distance from the pad area to a portion of the first connection line, which is connected to the first data line.

According to some example embodiments, a point of the first connection line, which has a maximum distance from the pad area to the first connection line, may be arranged between a portion of the first connection line, which is connected to the pad area, and a portion of the first connection line, which is connected to the first data line.

According to some example embodiments, a display device includes a substrate including a display area of which a corner of an edge is round, a peripheral area outside the display area, and a pad area in the peripheral area, a data line arranged in the display area, and a first connection line arranged in the display area in the form of steps and connected to the data line to transmit, to the data line, a signal from the pad area.

The above and other aspects, features, and characteristics of certain example embodiments of the present disclosure will be more apparent from the following description, the accompanying drawings, and claims.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
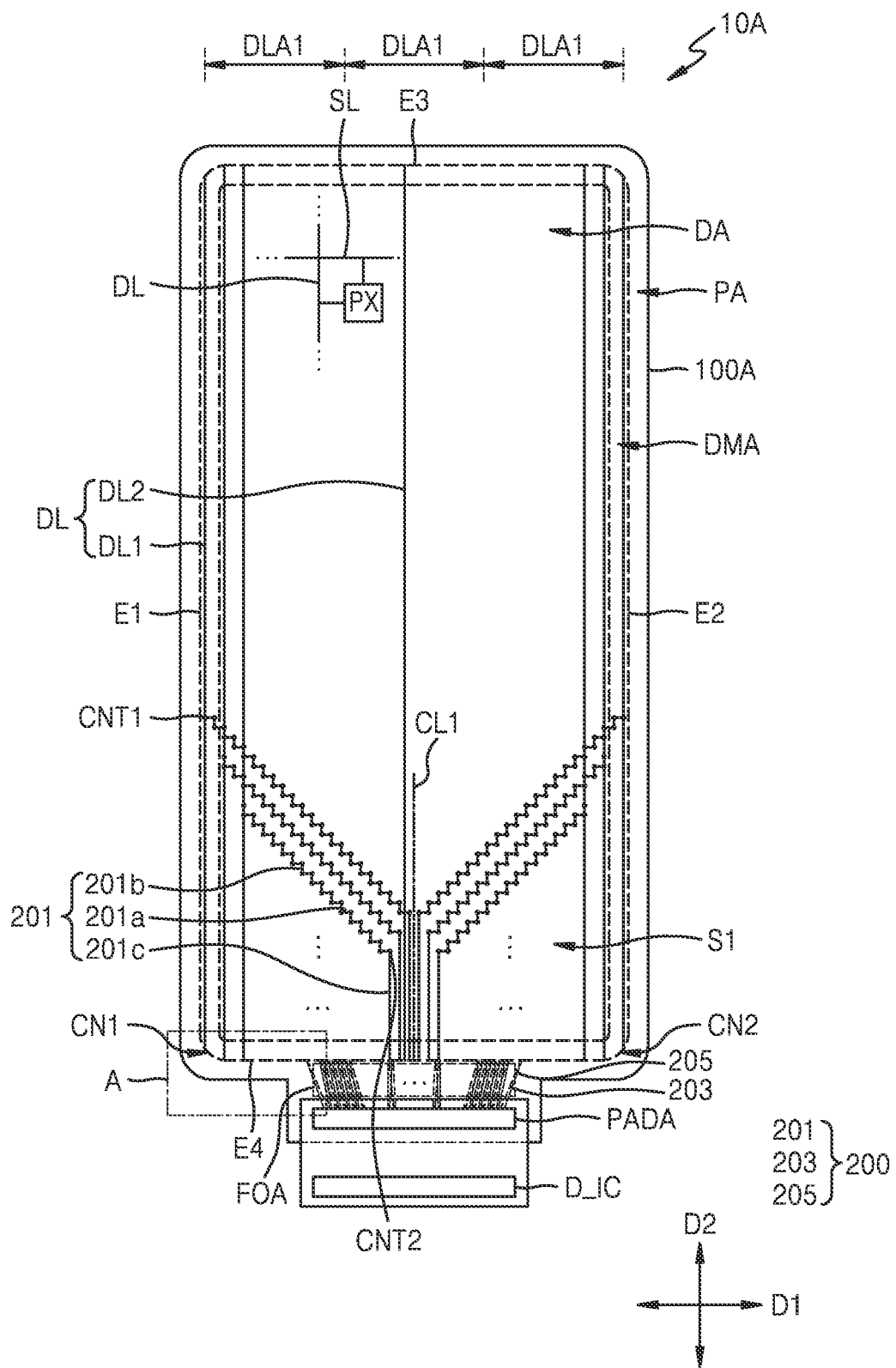
FIG. 1 is a schematic plan view of an example of a display panel according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description. The effects and features of the disclosure, and a method to achieve the same will become more apparent from the following example embodiments that are described in more detail in conjunction with the accompanying drawings. However, embodiments according to the present disclosure are not limited to the following example embodiments and embodiments according to the present disclosure may be embodied in various forms.

The following example embodiments will now be described more fully with reference to the accompanying drawings. When describing aspects of example embodiments with reference to the accompanying drawings, the same or corresponding elements are denoted by the same reference numerals and a redundant description thereof will be omitted.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be understood that the terms "comprises" and/or "comprising" used herein specify the presence of stated features or elements, but do not preclude the presence or addition of one or more other features or elements.

It will be understood that when a layer, region, or element is referred to as being connected to another layer, region, or element, it can be directly connected to the other layer, region, or element or indirectly connected to the other layer, region, or element via intervening layers, regions, or elements.

Sizes of elements in the drawings may be exaggerated for convenience of description. In other words, because the sizes and thicknesses of elements in the drawings are arbitrarily illustrated for convenience of description, the following embodiments are not limited thereto.

In the following example embodiments, the x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
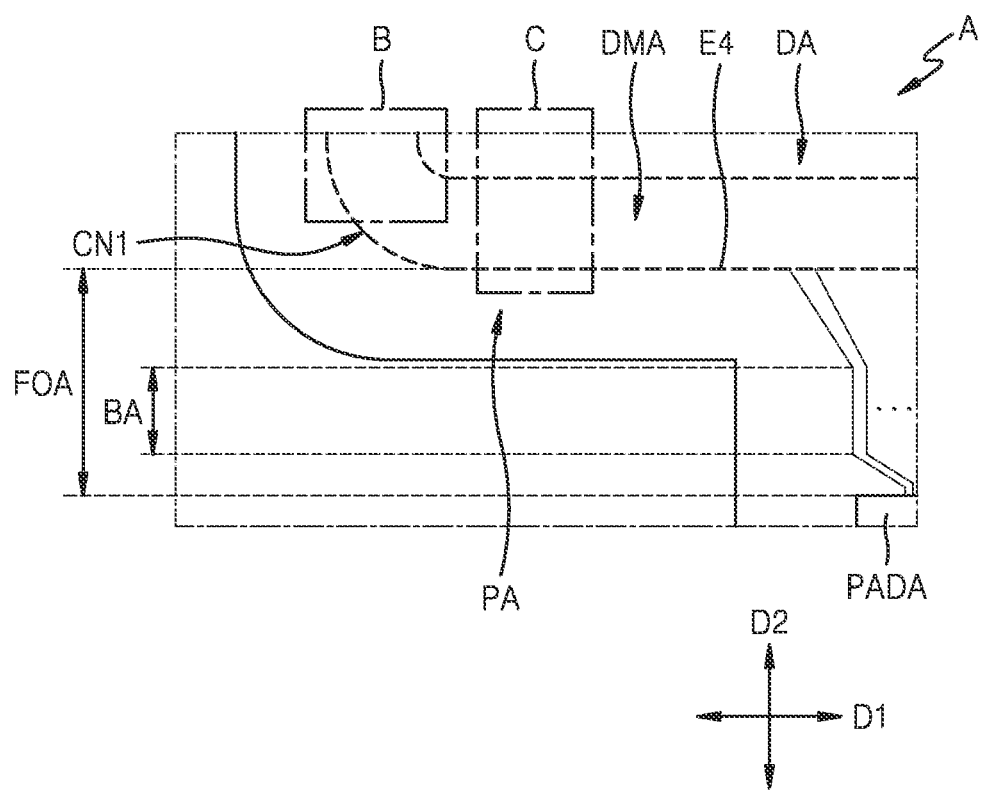
FIG. 2 is a schematic conceptual diagram of an area A of FIG. 1.
Figure 3:
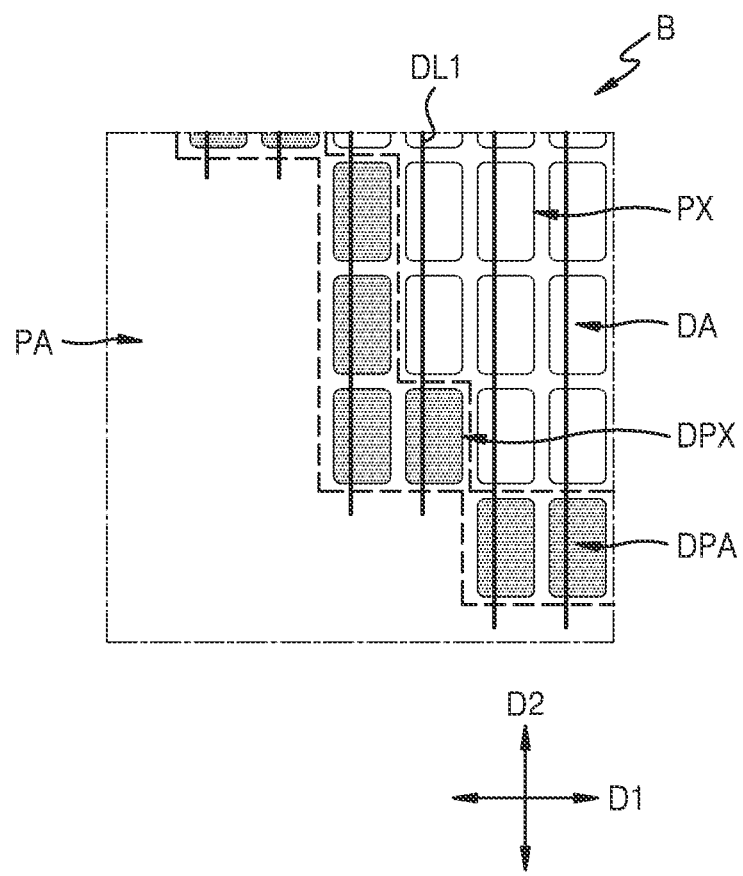
FIG. 3 is a schematic conceptual diagram of an area B of FIG. 2.
Figure 4:
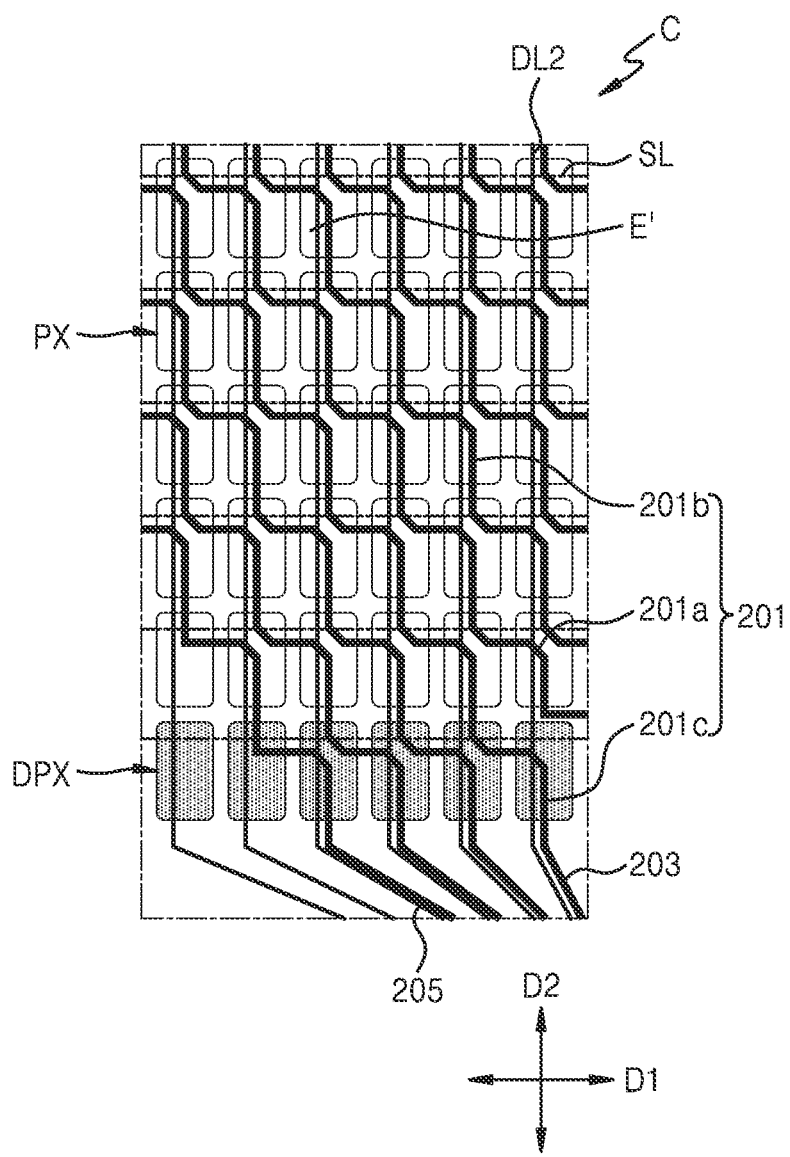
FIG. 4 is a schematic conceptual diagram of an area C of FIG. 2.

FIG. 1 is a schematic plan view of an example of a display panel 10A according to some example embodiments. FIG. 2 is a schematic conceptual diagram of an area A of FIG. 1, and FIG. 3 is a schematic conceptual diagram of an area B of FIG. 2. FIG. 4 is a schematic conceptual diagram of an area C of FIG. 2.

Referring to FIG. 1, the display panel 10A according to some example embodiments may include a display area DA at which images are displayed and a peripheral area PA located outside the display area DA (e.g., around a periphery of the display area DA, or outside a footprint of the display area DA). Thus, it may be understood that a substrate 100A provided in the display panel 10A includes the display area DA and the peripheral area PA.

An edge of the display area DA may have overall a shape that is the same as or similar to a rectangle or a square. According to some example embodiments, corners on the edge of the display area DA may form a right angle, although according to some example embodiments, one or more corners may have a rounded corner. For example, as shown in FIGS. 1 and 2, a first corner CN1 on the edge of the display area DA may be round. Hereinafter, for convenience of description, an embodiment in which the corners on the edge of the display area DA are round as shown in FIGS. 1 and 2 will be mainly described in detail, but embodiments according to the present disclosure are not limited thereto.

For example, the display area DA may include a first edge E1 and a second edge E2, which face each other, and a third edge E3 and a fourth edge E4, which are between the first edge E1 and the second edge E2 and face each other. A pad area PADA is adjacent to the fourth edge E4 among the first to fourth edges E1 to E4. In this case, the first corner CN1 that is round connects the first edge E1 and the fourth edge E4 to each other. In addition to the first corner CN1, a second corner CN2 on the edge of the display area DA may be round. The second corner CN2 connects the second edge E2 and the fourth edge E4 to each other. In addition, other portions on the edge of the display area DA may be round.

A plurality of pixels PX and wires via which an electrical signal is applied to the pixels PX may be located in the display area DA.

Each pixel PX may include a display element and a circuit unit for driving the display element. As an example, the display element may be an organic light-emitting device, and the circuit unit may include a plurality of transistors, a capacitor, etc.

Signal lines via which an electrical signal is applied to the pixels PX may include a plurality of scan lines SL, a plurality of data lines DL, etc. The scan lines SL each may extend in a first direction D1, and the data lines DL each may extend in a second direction D2. The scan lines SL may be arranged in, for example, a plurality of rows to transmit a scan signal to the pixels PX, and the data lines DL may be arranged in, for example, a plurality of columns to transmit a data signal to the pixels PX. The pixels PX each may be connected to a corresponding scan line SL of the scan lines SL and a corresponding data line DL of the data lines DL.

The peripheral area PA may surround the display area DA. The peripheral area PA may be an area in which pixels PX are not arranged and may include the pad area PADA, which is an area to which various electronic devices or printed circuit boards are attached. A voltage line that supplies power to drive the display element may be located in the peripheral area PA. A plurality of pads in the pad area PADA may be electrically connected to a film in which a driving integrated circuit (IC) D_IC is arranged. FIG. 1 illustrates a Chip on Film (COF) method in which the driving IC D_IC is arranged on the film electrically connected to the pads arranged on the substrate 100A. According to some example embodiments, the driving IC D_IC may be directly arranged on the substrate 100A using a Chip on Glass (COG) or Chip on Plastic (COP) method.

In addition, as shown in FIG. 2, the peripheral area PA may include a bending area BA, and the bending area BA may be between the pad area PADA and the display area DA. In this case, by making the substrate 100A bendable in the bending area BA, at least a portion of the pad area PADA may be located to overlap the display area DA. A bending direction is set such that the pad area PADA does not cover the display area DA, but the pad area PADA is located behind the display area DA. Accordingly, a user may recognize that the display area DA occupies most of the display panel 10A.

FIG. 3 is a schematic conceptual diagram of an area B of FIG. 2 and shows a portion of the first corner CN1. As shown FIGS. 1 and 2, as observed by a user who uses the display device according to the present embodiment or an electronic device including the same under a normal usage environment, the user may recognize or perceive that the first corner CN1 is round, that is, has a curved shape. However, in an environment in which wires having a width of several micrometers or several tens of micrometers are observable by enlarging the first corner CN1, as shown in FIG. 3, the first corner CN1 may appear to have a linear shape that is bent a plurality of times in the first direction D1 and the second direction D2. Though the first corner CN1 appears to have a linear shape that is bent a plurality of times (e.g., to form a stepped shape), as shown in FIG. 3, by enlarging the first corner CN1, the first corner CN1 is seen to be round, that is, have a curved shape. Therefore, hereinbelow, a case where the first corner CN1 is round will be described.

The display area DA may include a dummy area DMA. The dummy area DMA may be provided along the first to fourth edges E1 to E4 and the first and second corners CN1 and CN2 of the display area DA, and may be located adjacent to a boundary between the display area DA and the peripheral area PA. A plurality of dummy pixels DPX may be arranged in the dummy area DMA. The dummy pixels DPX may surround the pixels PX and may be located adjacent to the peripheral area PA. In FIG. 3, for convenience of description, only some of the pixels PX and some of the dummy pixels DPX in the display area DA are shown.

Connection lines 200 for transmitting, to signal lines connected to the pixels PX, an electrical signal supplied from the pads may be located on the substrate 100A. For example, the signal lines may be the data lines DL, and the connection lines 200 may be arranged between the data lines DL and the pad area PADA and transmit, to the data lines DL, a data signal supplied from the pads in the pad area PADA.

The connection lines 200 may include first connection lines 201 and second connection lines 203. The first connection lines 201 may be arranged in the display area DA, and the second connection lines 203 and third connection lines 205 may be arranged in the peripheral area PA. A portion of the first connection lines 201 may be arranged in the dummy area DMA. The second connection lines 203 and the third connection lines 205 may be arranged in a fan-out area FOA located in the peripheral area PA. The fan-out area FOA may be between the pad area PADA and the display area DA.

First connection lines 201 arranged on the left side of a first central line CL1 passing through the center of the display panel 10A in the first direction D1 and first connection lines 201 arranged on the right side of the first central line CL1 may be approximately bilaterally symmetrical with respect to the first central line CL1.

At least a portion of each first connection line 201 may be located on a different layer from the scan lines SL and the data lines DL of the pixels PX. Each first connection line 201 may include a first portion 201a extending in the first direction D1, and a second portion 201b and a third portion 201c extending in the second direction D2 from both ends of the first portion 201a. The first portion 201a and may connect the second portion 201b and the third portion 201c to each other, and the first portion 201a, the second portion 201b, and the third portion 201c may be formed as one body. A first portion 201a of each of the first connection lines 201 may extend parallel to a scan line SL of each pixel PX and may partially overlap with or be adjacent to the scan line SL. The first portion 201a of each first connection line 201 may extend parallel to a scan line SL arranged in one of the rows. A second portion 201b and a third portion 201c of each first connection line 201 may extend parallel to a first data line DL1 and may partially overlap with or be adjacent to the first data line DL1. The second portion 201b of each first connection line 201 may extend parallel to a data line DL arranged in one of the columns. The third portion 201c of each first connection line 201 may extend parallel to a second data line DL2 arranged in one of the columns.

The first portion 201a and the second portion 201b as described above may be provided as at least one first portion 201a and at least one second portion 201b, respectively. In this case, the first portion 201a and the second portion 201b are alternately arranged and connected to each other. At this time, different first portions 201a may be arranged to be parallel to different scan lines SL, respectively, and different second portions 201b may be arranged to be parallel to different data lines DL, respectively. In addition, the first connection line 201 as described above may extend in a direction away from the pad area PADA to be connected to the data line DL. That is, the first connection line 201 may extend away from the pad area PADA, from a portion of the first connection line 201 connected to the second connection line 203 toward a portion of the first connection line 201 connected to the data line DL. In this case, the first connection line 201 may be in the form of steps to sequentially extend away from the pad area PADA.

One end of the first connection line 201 may be connected to the first data line DL1, and the other end of the first connection line 201 may be connected to the second connection line 203. That is, the first portion 201a of the first connection line 201 may be connected to the first data line DL1 at a first contact portion CNT1. In this case, the first contact portion CNT1 may be in the form of a contact hole. The third portion 201c of the first connection line 201 may be connected to the second connection line 203. According to some example embodiments, the second connection line 203 may be a portion in which the second portion 201b of the first connection line 201 extends to the peripheral area PA through the dummy area DMA, or a portion in which the third portion 201c of the first connection line 201, which will be described later, extends to the peripheral area PA through the dummy area DMA. One end of the second connection line 203 may be connected to the other end of the first connection line 201, and the other end of the second connection line 203 may be connected to the pad area PADA.

The connection lines 200 may further include third connection lines 205. One end of the third connection line 205 may be connected to the second data line DL2, and the other end of the third connection line 205 may be connected to the pad area PADA. The one end of the third connection line 205 may be connected to the second data line DL2 in the dummy area DMA. The third connection line 205 may be a portion in which the second data line DL2 that is not connected to the first connection line 201 extends to the peripheral area PA through the dummy area DMA.

In the case described above, according to some example embodiments, the data lines DL of the display panel 10A may include only the first data lines DL1, and each first data line DL1 may be connected to each first connection line 201 one by one. According to some example embodiments, the data lines DL of the display panel 10A may include the first data lines DL1 and the second data lines DL2. In this case, each first data line DL1 may be connected to each pad through each first connection line 201 and each second connection line 203, and each second data line DL2 may be connected to each pad through each third connection line 205. Hereinafter, for convenience of description, a case where the data lines DL include the first data line DL1 and the second data line DL2 will be mainly described in more detail.

The display panel 10A may include first data line arrangement areas DLA1 in which a plurality of first data lines DL1 are arranged and a second data line arrangement area DLA2 in which a plurality of second data lines DL2 are arranged. In this case, the first data line arrangement area DLA1 may be arranged outside the second data line arrangement area DLA2, and the second data line arrangement area DLA2 may be arranged between the first data line arrangement areas DLA1 that are symmetrically arranged with respect to the second data line arrangement area DLA2. Hereinbelow, for convenience of description, a case where the display panel 10A includes the first data line arrangement areas DLA1 and the second data line arrangement area DLA2 will be mainly described in detail.

The first connection line 201 as described above may have various shapes. According to some example embodiments, the first connection line 201 may include the first portion 201a, the second portion 201b, and the third portion 201c. In addition, the first connection lines 201 may all be connected to the first data lines DL1 to correspond one by one to the first data lines DL1, respectively. According to some example embodiments, some of the first connection lines 201 may be connected to the first data lines DL1, and the others of the first connection lines 201 may not be connected to the first data lines DL1. In this case, the others of the first connection lines 201 which are not connected to the first data lines DL1 may include only the third portion 201c. When the first connection line 201 includes only the third portion 201c, the third portion 201c may be connected to one of the second connection lines 203. Hereinbelow, for convenience of description, a case where the first connection line 201 is connected to each first data line DL1 will be mainly described in more detail.

Figure 5A:
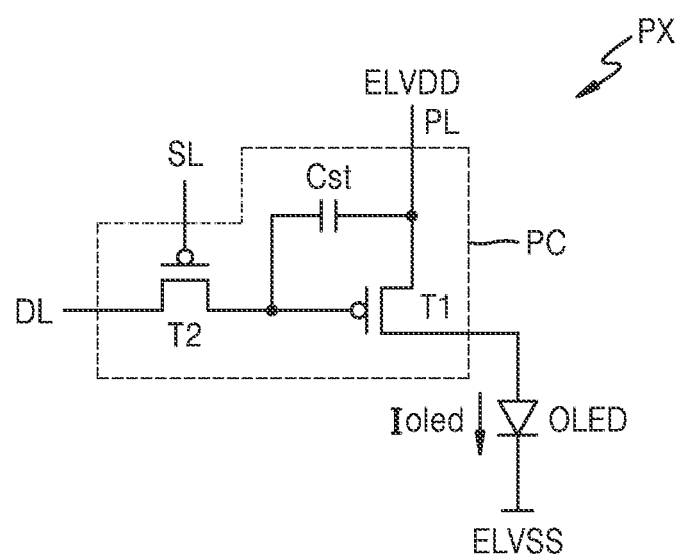
FIGS. 5A and 5B are equivalent circuit diagrams of any one pixel arranged on a display panel, according to some example embodiments.
Figure 5B:
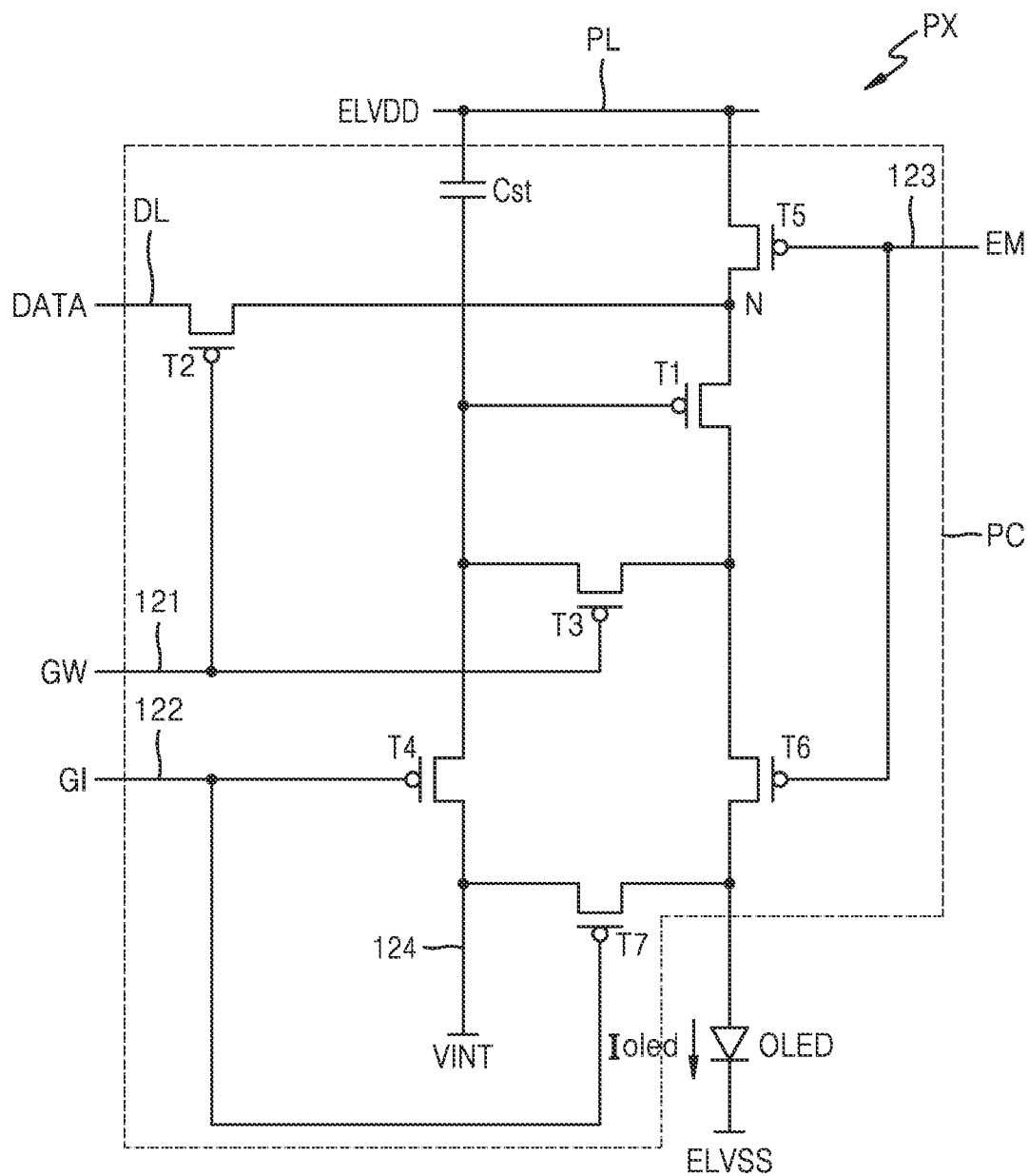

FIGS. 5A and 5B are equivalent circuit diagrams of any one pixel PX arranged on a display panel, according to some example embodiments.

Referring to FIG. 5A, the pixel PX includes a pixel circuit PC and an organic light-emitting diode OLED, which is a display element connected to the pixel circuit PC. The pixel circuit PC may include a first transistor T1, a second transistor T2, and a capacitor Cst. Each pixel PX may emit, for example, red, green, blue, or white light from the organic light-emitting diode OLED. The first transistor T1 and the second transistor T2 may include thin-film transistors.

The second transistor T2, which is a switching transistor, may be connected to the scan line SL and the data line DL and may be configured to transmit, to the first transistor T1, a data signal input from the data line DL according to a switching voltage input from the scan line SL. The capacitor Cst may be connected to the second transistor T2 and a power voltage line PL and may be configured to store a voltage corresponding to a difference between a voltage corresponding to the data signal received from the second transistor T2 and a first power voltage ELVDD supplied through the power voltage line PL. The power voltage line PL may be spaced apart parallel to the scan line SL or the data line DL.

The first transistor T1, which is a driving transistor, may be connected to the power voltage line PL and the capacitor Cst and may be configured to control a driving current Ioled flowing through the organic light-emitting diode OLED from the power voltage line PL in response to a value of the voltage stored in the capacitor Cst. The organic light-emitting diode OLED may emit light having a certain luminance according to the driving current Ioled. An opposite electrode (e.g., a cathode) of the organic light-emitting diode OLED may receive a second power voltage ELVSS.

Though FIG. 5A illustrates that the pixel circuit PC includes two transistors and one capacitor, the embodiments according to the present disclosure are not limited thereto. The number of transistors and the number of capacitors may be variously changed according to the design of the pixel circuit PC.

Referring to FIG. 5B, though it is shown that signal lines 121, 122, 123, and DL, an initialization voltage line 124, and a power voltage line PL are provided for each pixel PX, the embodiments according to the present disclosure are not limited thereto. According to some example embodiments, at least one of the signal lines 121, 122, 123, or DL, the initialization voltage line 124, and/or the power voltage line PL may be shared by neighboring pixels.

The signal lines include a first scan line 121 configured to transmit a first scan signal GW, a second scan line 122 configured to transmit a second scan signal GI, an emission control line 123 configured to transmit an emission control signal EM, and a data line DL that intersects with the first scan line 121 and is configured to transmit a data signal DATA. The second scan line 122 may be connected to a first scan line 121 in a next row or a previous row, and the second scan signal GI may be a first scan signal GW in a next row or a previous row.

The power voltage line PL may be configured to transmit a first power voltage ELVDD to the first transistor T1, and the initialization voltage line 124 may be configured to transmit, to the pixel PX, an initialization voltage VINT that initializes the first transistor T1 and a pixel electrode of the organic light-emitting diode OLED.

The first scan line 121, the second scan line 122, the emission control line 123, and the initialization voltage line 124 may extend in the first direction D1 and may be arranged in each row to be spaced apart from each other. The data line DL and the power voltage line PL may extend in the second direction D2 and may be arranged in each column to be spaced apart from each other.

The first scan line 121 and the second scan line 122 may be the scan lines SL shown in FIG. 1. The scan lines SL may be connected to pixels PX arranged in a line. In this case, the first scan line 121 and the second scan line 122 may pass through one of the pixels PX arranged in a line. In addition, the first scan line 121 and the second scan line 122 respectively passing through each of the pixels PX arranged in a line may be configured to input different scan signals to each pixel PX according to driving of each pixel PX. In this case, a plurality of scan lines SL are provided, and the scan lines SL may be arranged in the respective rows to extend in the first direction D1 and may be spaced apart from each other in the second direction D2.

The pixel circuit PC of the pixel PX may include first to seventh transistors T1, T2, T3, T4, T5, T6, and T7, and a capacitor Cst. The first to seventh transistors T1 to T7 may include thin-film transistors.

The first transistor T1 is connected to the power voltage line PL via the fifth transistor T5 and is electrically connected to the pixel electrode of the organic light-emitting diode OLED via the sixth transistor T6. The first transistor T1 functions as a driving transistor and is configured to receive the data signal DATA according to a switching operation of the second transistor T2 to supply the driving current Ioled to the organic light-emitting diode OLED.

The second transistor T2 is connected to the first scan line 121 and the data line DL, and is turned on according to the first scan signal GW received through the first scan line 121 to perform a switching operation of transmitting, to a node N, the data signal DATA transmitted to the data line DL.

The third transistor T3 is connected to the pixel electrode of the organic light-emitting diode OLED via the sixth transistor T6. The third transistor T3 is turned on according to the first scan signal GW received through the first scan line 121 to diode-connect the first transistor T1.

The fourth transistor T4 is turned on according to the second scan signal GI received through the second scan line 122 to transmit, to a gate electrode of the first transistor T1, the initialization voltage VINT from the initialization voltage line 124, to thus initialize a gate voltage of the first transistor T1.

The fifth transistor T5 and the sixth transistor T6 are simultaneously (or concurrently) turned on according to the emission control signal EM received through the emission control line 123 to form a current path via which the driving current Ioled flows in a direction from the power voltage line PL to the organic light-emitting diode OLED.

The seventh transistor T7 is turned on according to the second scan signal GI received through the second scan line 122 to transmit, to the pixel electrode of the organic light-emitting diode OLED, the initialization voltage VINT from the initialization voltage line 124, to thus initialize the pixel electrode of the organic light-emitting diode OLED. The seventh transistor T7 may be omitted.

Though FIG. 5B illustrates a case where the fourth transistor T4 and the seventh transistor T7 are connected to the second scan line 122, the embodiments according to the present disclosure are not limited thereto. According to some example embodiments, the fourth transistor T4 may be connected to the second scan line 122, and the seventh transistor T7 may be connected to a separate wire to be driven according to a signal transmitted to the wire.

The capacitor Cst may be connected to the power voltage line PL and the gate electrode of the first transistor T1, to store and maintain a voltage corresponding to a difference between voltages at both ends to thus maintain a voltage applied to the gate electrode of the first transistor T1.

The organic light-emitting diode OLED may include the pixel electrode, a common electrode facing the pixel electrode, and an emission layer between the pixel electrode and the common electrode. The common electrode may receive the second power voltage ELVSS. The organic light-emitting diode OLED receives the driving current Ioled from the first transistor T1 and emits light to display an image.

The dummy pixel DPX includes the same pixel circuit PC as the pixel PX of FIGS. 5A and 5B and does not include some elements of the organic light-emitting diode OLED and thus may not emit light. According to some example embodiments, the dummy pixel DPX may not include a pixel electrode and may include an emission layer and an opposite electrode.

Figure 6:
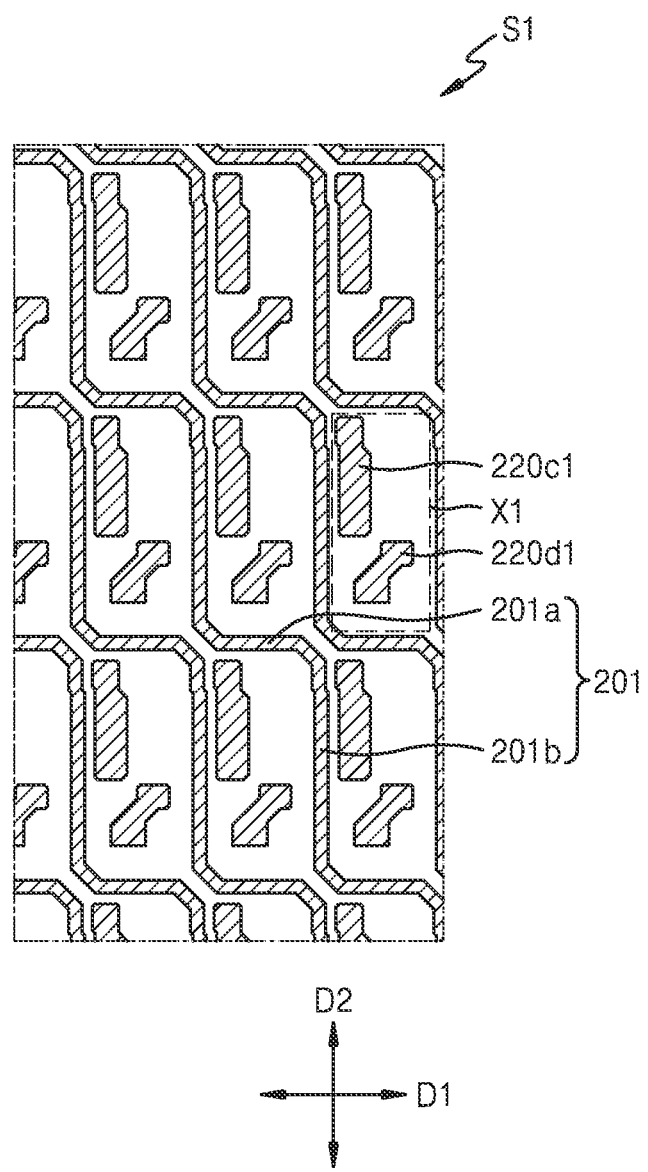
FIG. 6 is a schematic conceptual diagram of a first area of FIG. 1.
Figure 7:
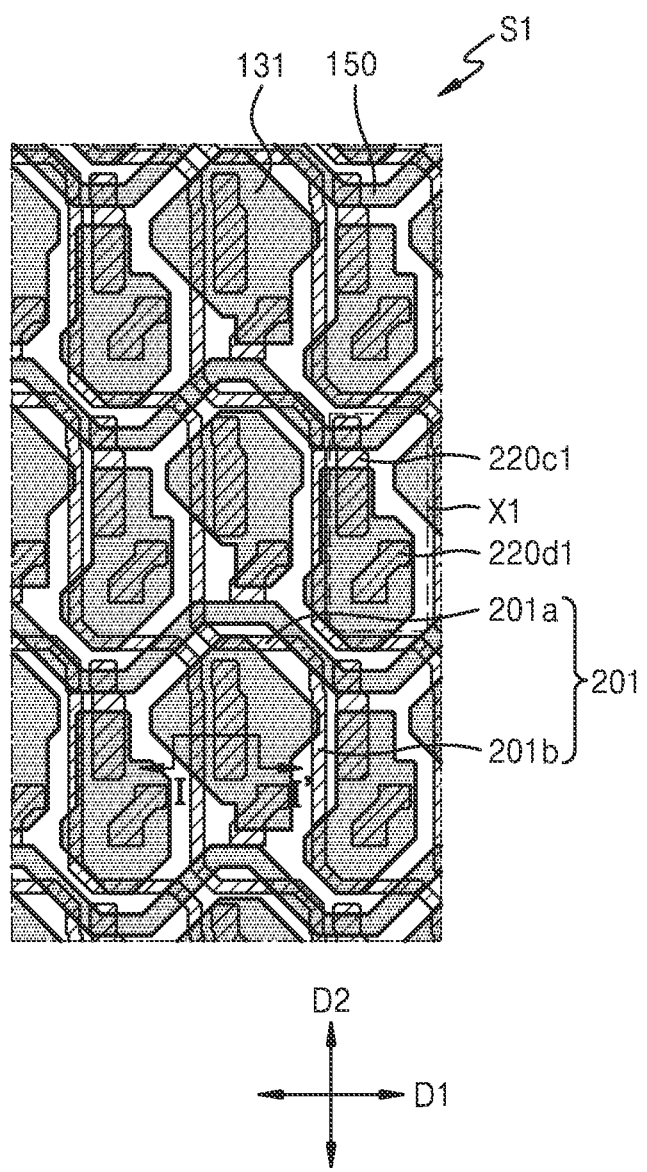
FIG. 7 is an exemplary view of a pixel electrode and a shielding member arranged on first connection lines, according to some example embodiments.
Figure 8:
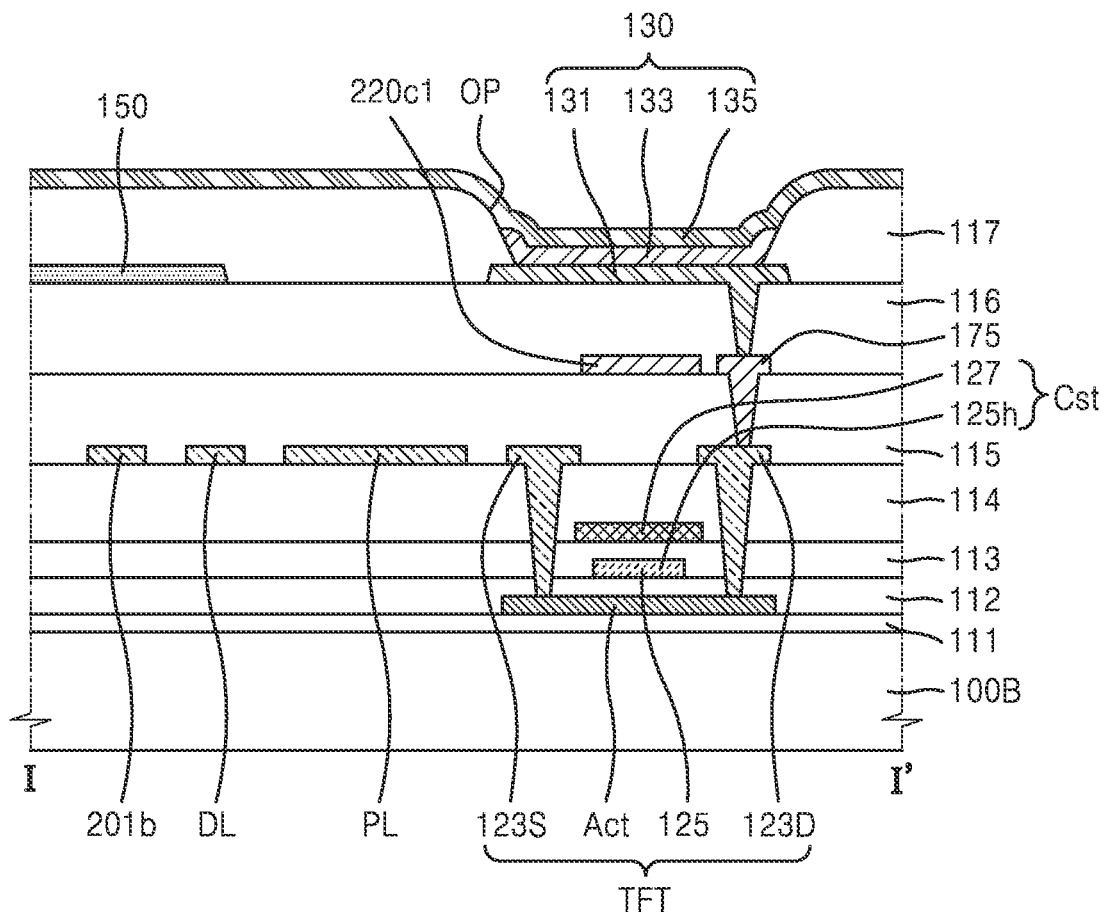
FIG. 8 is a cross-sectional view of a first area taken along a line I-I' of FIG. 7.

FIG. 6 is a schematic conceptual diagram of a first area S1 of FIG. 1. FIG. 7 is an exemplary view of a pixel electrode 131 and a shielding member 150 arranged on first connection lines 201, according to some example embodiments. FIG. 8 is a cross-sectional view of a first area taken along a line I-I' of FIG. 7.

As shown in FIGS. 6 and 7, first pattern areas X1 divided between adjacent first connection lines 201 may be located in the first area S1 formed by a first connection line 201 arranged outermost and a first connection line 201 arranged innermost. In this case, according to some example embodiments, each first connection line 201 may include at least one dummy pattern 220c1 or 220d1 arranged in the first pattern area X1. According to some example embodiments, each first connection line 201 may not include at least one dummy pattern 220c1 or 220d1. Hereinbelow, for convenience of description, a case where the first connection line 201 includes the dummy patterns 220c1 and 220d1 will be mainly described in more detail.

The dummy patterns 220c1 and 220d1 may be arranged in the first pattern area X1. According to some example embodiments, a dummy line may be arranged in an area of the first area S1 in which the first connection lines 201 are not arranged. The dummy line may be disconnected from the first connection lines 201 and may have various structures to divide the first pattern areas X1. For example, the dummy line may have a linear structure or a lattice structure.

The first connection lines 201, the dummy patterns 220c1 and 220d1 of the first pattern area X1, and the dummy line may be arranged on the same layer. In addition, the first connection lines 201, the dummy patterns 220c1 and 220d1 of the first pattern area X1, and the dummy line may be formed in the same process. In this case, the dummy patterns 220c1 and 220d1 and the dummy line may be in a floating state.

Because reflection characteristics of light in the first area S1 become similar by the first pattern areas X1, the first area may be prevented or minimized from being recognized as divided according to an incident angle of light. The dummy patterns 220c1 and 220d1 may prevent signal interference between the first connection lines 201 and may enable a greater pattern density during the manufacturing process.

As shown in FIG. 6, second portions 201b of a pair of adjacent first connection lines 201 may be spaced apart from each other to exceed a length (second length) corresponding to an interval between a first scan line 121 and a second scan line 122, which are adjacent in the second direction D2. In this case, the second portions 201b of the first connection lines 201 each may pass through one first scan line 121 or one second scan line 122. First portions 201a of the pair of adjacent first connection lines 201 may be spaced apart from each other by a length (first length) or less corresponding to an interval between two data lines DL, which are adjacent in the first direction D1.

A display element may be arranged on the first connection lines 201. In this case, according to some example embodiments, at least a portion of the first connection line 201 may be arranged to overlap a pixel electrode 131 in a plan view. According to some example embodiments, the first connection line 201 may be arranged not to overlap the pixel electrode 131 in a plan view. Hereinbelow, for convenience of description, a case where at least a portion of the first connection line 201 is arranged to overlap the pixel electrode 131 in a plan view will be mainly described in detail.

A plurality of pixels PX may be arranged in a display area DA of a substrate 100B. A thin-film transistor TFT, a capacitor Cst, and a display element 130 electrically connected to the thin-film transistor TFT may be arranged in each pixel PX. The display element 130 may be the organic light-emitting diode OLED of FIGS. 5A and 5B. The thin-film transistor TFT may be one of the transistors of FIGS. 5A and 5B. For example, the thin-film transistor TFT shown in FIG. 8 may be the first transistor T1 of FIGS. 5A and 5B.

The substrate 100B may include various materials such as a glass material, a metallic material, or a plastic material. According to some example embodiments, the substrate 100B may be a flexible substrate and may include, for example, a polymer resin such as polyethersulfone (PES), polyacrylate, polyetherimide (PEI), polyethylene naphthalate (PEN), polyethylene terephthalate (PET), polyphenylene sulfide (PPS), polyarlylate (PAR), polyimide (PI), polycarbonate (PC), or cellulose acetate propionate (CAP). The substrate 100B may have a multi-layered structure including a layer including the aforementioned polymer resin, and an inorganic layer.

A buffer layer 111 may be located on the substrate 100B as necessary. The buffer layer 111 may planarize a surface of the substrate 100B or prevent impurities or the like from penetrating a semiconductor layer thereon. The buffer layer 111 may have a single-layered/multi-layered structure including an inorganic insulating material such as silicon oxide, silicon nitride, or silicon oxynitride. The buffer layer 111 may be omitted.

The thin-film transistor TFT may be arranged on the buffer layer 111. The thin-film transistor TFT may include a semiconductor layer Act, a gate electrode 125, a source electrode 123S, and a drain electrode 123D.

The semiconductor layer Act may include amorphous silicon, polycrystalline silicon, or an organic semiconductor material. The semiconductor layer Act may include a source region, a drain region, and a channel region between the source region and the drain region.

Considering adhesion to adjacent layers, surface flatness of layers to be stacked, and processability, the gate electrode 125 may include a single layer or a multi-layer including, for example, one or more materials of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A first insulating layer 112 may be arranged between the semiconductor layer Act and the gate electrode 125. A second insulating layer 113 and a third insulating layer 114 may be arranged between the gate electrode 125 and the source electrode 123S and between the source electrode 123S and the drain electrode 123D. The first insulating layer 112, the second insulating layer 113, and the third insulating layer 114 may include an inorganic material such as silicon oxide, silicon nitride, and/or silicon oxynitride. According to some example embodiments, the scan lines SL, the first scan line 121, the second scan line 122, and the emission control line 123 of FIGS. 5A and 5B may be arranged on the same layer as the gate electrode 125, that is, on the first insulating layer 112.

The source electrode 123S and the drain electrode 123D may be electrically connected to the source region and the drain region of the semiconductor layer Act through contact holes formed in the first insulating layer 112, the second insulating layer 113, and the third insulating layer 114, respectively.

The source electrode 123S and the drain electrode 123D may include a single layer or a multi-layer including, for example, one or more materials of Al, Pt, Pd, Ag, Mg, Au, Ni, Nd, Ir, Cr, Li, Ca, Mo, Ti, W, and Cu.

The capacitor Cst includes a lower electrode 125h and an upper electrode 127 overlapping each other with the second insulating layer 113 therebetween. The capacitor Cst may overlap the thin-film transistor TFT. In this regard, FIG. 8 illustrates that the gate electrode 125 of the thin-film transistor TFT is the lower electrode 125h of the capacitor Cst. According to some example embodiments, the capacitor Cst may not include the thin-film transistor TFT, and the lower electrode 125h of the capacitor Cst may be a separate element independent from the gate electrode 125 of the thin-film transistor TFT. The capacitor Cst may be covered by the third insulating layer 114. According to some example embodiments, the initialization voltage line 124 of FIG. 5B may be arranged on the same layer as the upper electrode 127 of the capacitor Cst, that is, on the second insulating layer 113.

The pixel circuit including the thin-film transistor TFT and the capacitor Cst may be covered by a fourth insulating layer 115 and a fifth insulating layer 116. The fourth insulating layer 115 and the fifth insulating layer 116, which are planarization insulating layers, may be organic insulating layers. The fourth insulating layer 115 and the fifth insulating layer 116 may include an organic insulating material such as a general-purpose polymer such as polymethyl methacrylate (PMMA) or polystyrene (PS), polymer derivatives having a phenol-based group, an acryl-based polymer, an imide-based polymer, and an aryl ether-based polymer, an amide-based polymer, a fluorine-based polymer, a p-xylene-based polymer, a vinyl alcohol-based polymer, or blends thereof. According to some example embodiments, the fourth insulating layer 115 and the fifth insulating layer 116 may include polyimide.

Various conductive layers may be further arranged on the third insulating layer 114. For example, the data line DL and the power voltage line PL may be arranged on the third insulating layer 114, that is, the same layer as the source electrode 123S and the drain electrode 123D. In this case, the data line DL is not limited to the above layer and may be arranged on the fourth insulating layer 115. However, hereinbelow, for convenience of description, a case where the data line DL and the power voltage line PL are arranged on the third insulating layer 114 will be mainly described in detail.

The fourth insulating layer 115 may be arranged on the data line DL and the power voltage line PL. As shown in FIG. 8, a portion of the first connection line 201 (e.g., one of the first portion 201a and the second portion 201b), the dummy line, and the dummy patterns 220c1 and 220d1 may be arranged on the fourth insulating layer 115. The first connection line 201, the dummy line, and the dummy patterns 220c1 and 220d1 may include a single layer or a multi-layer including at least one of Al, Cu, Ti, or alloys thereof. The fifth insulating layer 116 may be arranged on the first connection line 201, the dummy line, and the dummy patterns 220c1 and 220d1. According to some example embodiments, in a plan view, a portion of the first connection line 201 (e.g., at least one of the dummy line or the dummy patterns 220c1 or 220d1) may overlap the data line DL, and a portion of the first connection line 201 (e.g., the first portion 201a or the second portion 201b) may overlap the scan line SL.

In the case described above, the data line DL may be arranged on a different layer from the first portion 201a of the first connection line 201, the dummy line, and the dummy patterns 220c1 and 220d1. For example, when the data line DL is arranged on the third insulating layer 114, the first portion 201a of the first connection line 201, the dummy line, and the dummy patterns 220c1 and 220d1 may be arranged on the fourth insulating layer 115. When the data line DL is arranged on the fourth insulating layer 115, the second portion 201b of the first connection line 201, the dummy line, and the dummy patterns 220c1 and 220d1 may be arranged on the third insulating layer 114. According to some example embodiments, the first connection line 201 may be entirely arranged on a different layer from the data line DL. Hereinbelow, for convenience of description, a case where the data line DL is arranged on the third insulating layer 114, and the first portion 201a of the first connection line 201, the dummy line, and the dummy patterns 220c1 and 220d1 are arranged on the fourth insulating layer 115 will be mainly described in detail.

The display element 130 may be arranged on the fifth insulating layer 116. The display element 130 may include the pixel electrode 131, an opposite electrode 135, and an intermediate layer 133 between the pixel electrode 131 and the opposite electrode 135.

The pixel electrode 131 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 131 may include a reflective layer including Ag, Mg, Al, Pt, Pd, Au, Ni, Nd, Ir, Cr, or compounds thereof. According to some example embodiments, the pixel electrode 131 may further include a layer including ITO, IZO, ZnO, or $In_2O_3$ above/under the aforementioned reflective layer.

A shielding member 150 may be further arranged on the fifth insulating layer 116. The shielding member 150 may extend in the first direction D1 along a portion of an edge of the pixel electrode 131 so as not to overlap the pixel electrode 131 on a plane, and may be arranged above or under each row. The shielding member 150 may have a linear shape extending in the first direction D1 or a zigzag shape according to the arrangement of pixel electrodes 131 in the same row. The shielding member 150 may include light-shielding metal. For example, the shielding member 150 may include Mo, Al, Cu, Ti, etc. and may include a multi-layer or a single layer including the above material. According to some example embodiments, the shielding member 150 may include a multi-layer of Ti/Al/Ti. The shielding member 150 may include the same material as the pixel electrode 131. The shielding members 150 may be spaced apart from each other and provided independently for each row. The shielding members 150 may be floated or electrically connected to a constant voltage wire (e.g., a power voltage line, an initialization voltage line, etc.) to receive a constant voltage.

A sixth insulating layer 117 covering the edge of the pixel electrode 131 may be arranged on the fifth insulating layer 116. The sixth insulating layer 117 may include an opening OP exposing a portion of the pixel electrode 131, to thus define pixels. The sixth insulating layer 117 may include an organic material such as acryl, benzocyclobutene (BCB), polyimide, or hexamethyldisiloxane (HMDSO). Alternatively, the sixth insulating layer 117 may include the aforementioned inorganic material.

The intermediate layer 133 may be formed on the pixel electrode 131 exposed by the opening OP of the sixth insulating layer 117. The intermediate layer 133 includes an emission layer. The emission layer may include a polymer organic material or a low molecular weight organic material that emits light of a certain color. The emission layer may be a red emission layer, a green emission layer, or a blue emission layer. Alternatively, the emission layer may have a multi-layered structure in which a red emission layer, a green emission layer, and a blue emission layer are arranged so as to emit white light, or may have a single-layered structure including a red emission material, a green emission material, and a blue emission material. According to some example embodiments, the intermediate layer 133 may include a first functional layer arranged under the emission layer and/or a second functional layer arranged above the emission layer. The first functional layer and/or the second functional layer may include an integral layer over the pixel electrodes 131 or may include a patterned layer to correspond to each of the pixel electrodes 131.

The first functional layer may include a single layer or a multi-layer. For example, when the first functional layer includes a polymer material, the first functional layer is a hole transport layer (HTL) having a single-layered structure and may be formed with poly-(3,4)-ethylene-dihydroxy thiophene (PEDOT) or polyaniline (PANI). When the first functional layer includes a low molecular weight material, the first functional layer may include a hole injection layer (HIL) and an HTL.

The second functional layer may be omitted. For example, when the first functional layer and the emission layer include a polymer material, the second functional layer may be formed in order to improve the characteristics of an organic light-emitting diode. The second functional layer may include a single layer or a multi-layer. The second functional layer may include an electron transport layer (ETL) and/or an electron injection layer (EIL).

The opposite electrode 135 is arranged to face the pixel electrode 131 with the intermediate layer 133 therebetween. The opposite electrode 135 may include a conductive material having a low work function. For example, the opposite electrode 135 may include a (semi-)transparent layer including Ag, Mg, Al, Pt, Pd, Au, Ni, Nd, Ir, Cr, Li, Ca, or alloys thereof. Alternatively, the opposite electrode 135 may further include a layer such as ITO, IZO, ZnO, or $In_2O_3$ on a (semi-)transparent layer including the aforementioned material.

Figure 9A:
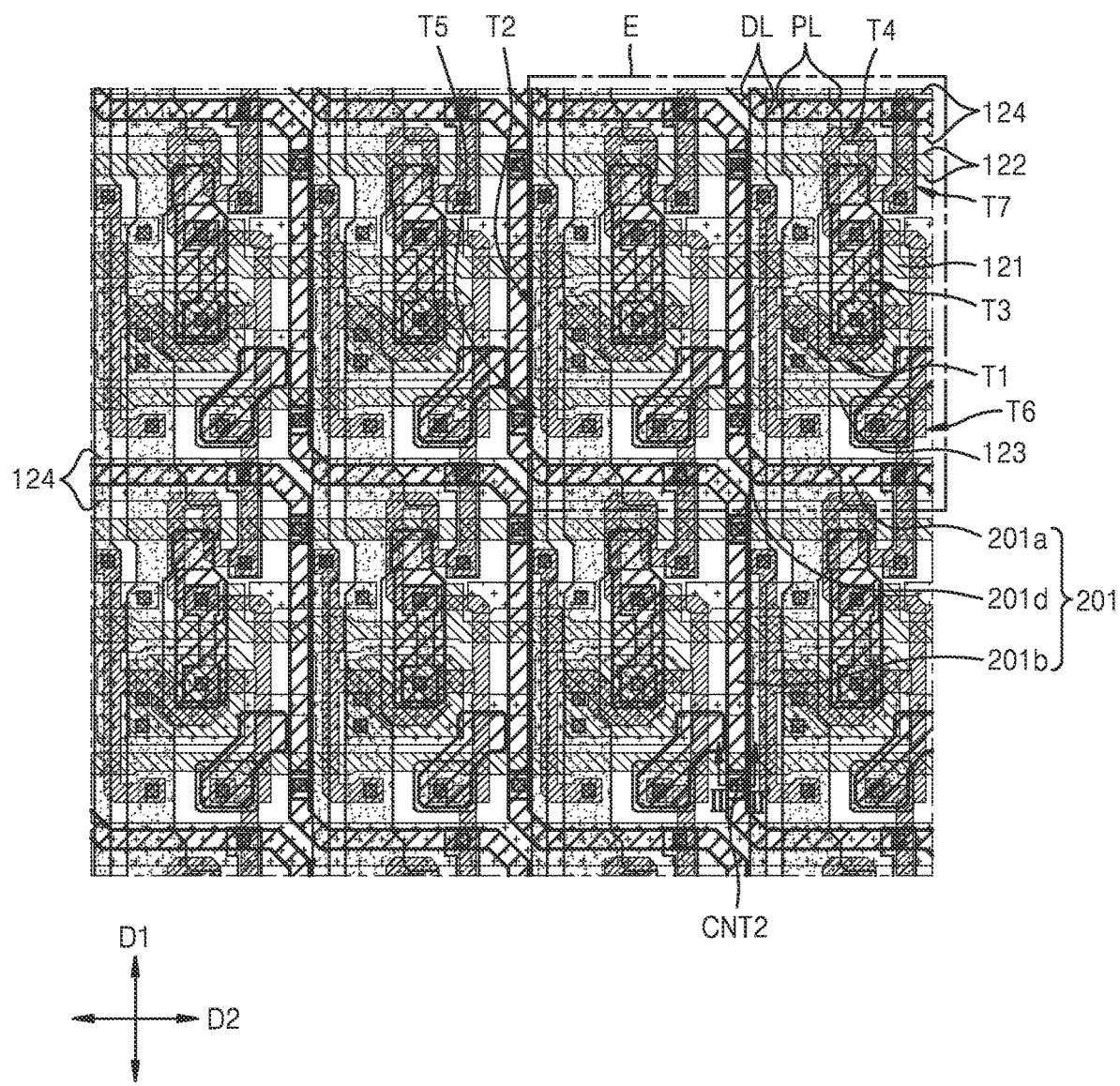
FIG. 9A is a schematic layout view of electrodes and wires according to some example embodiments.
Figure 9B:
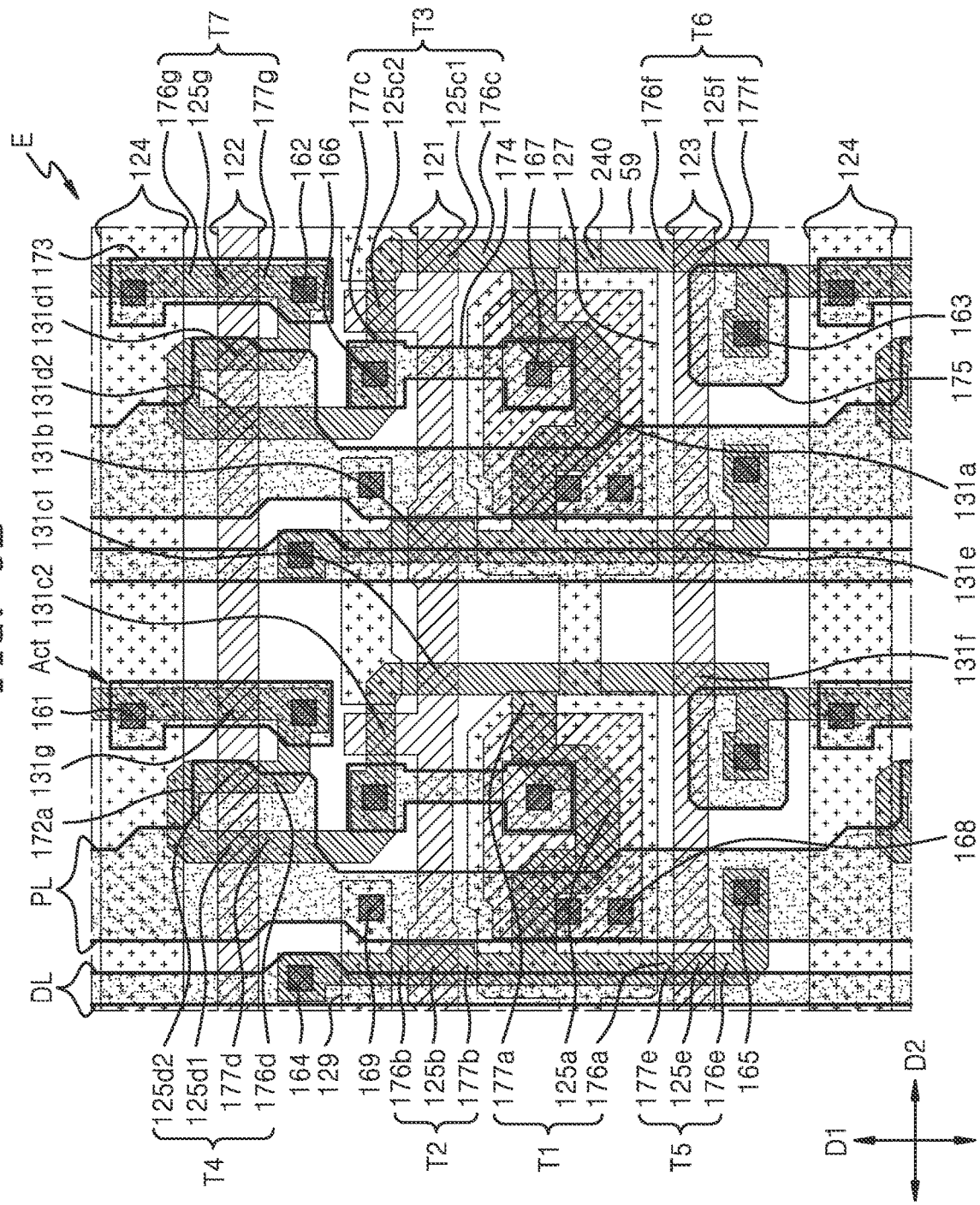
FIG. 9B is an enlarged view of an area E of FIG. 9A.
Figure 10A:
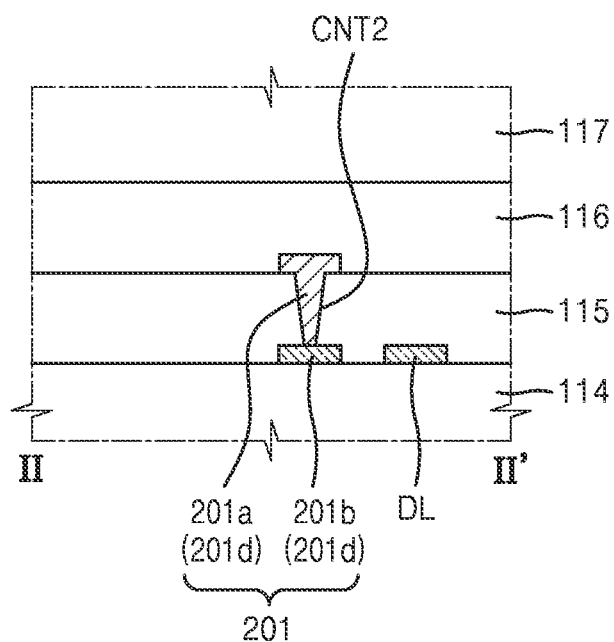
FIGS. 10A to 10C are cross-sectional views taken along a line II-II' of FIGS. 9A.
Figure 10B:
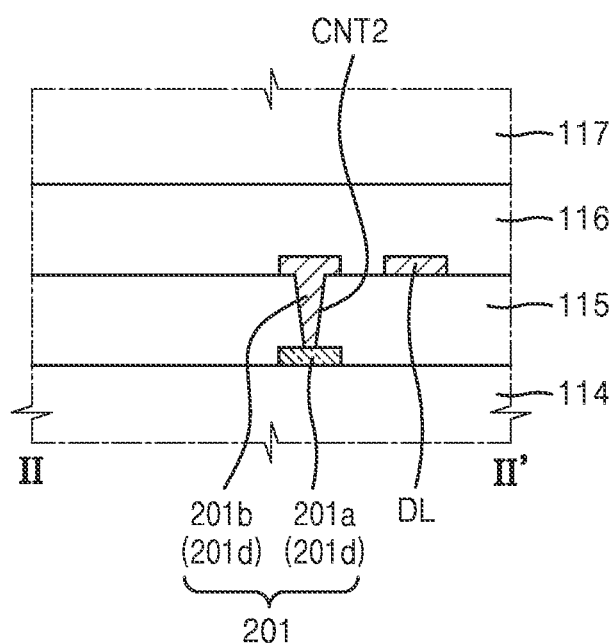
Figure 10C:
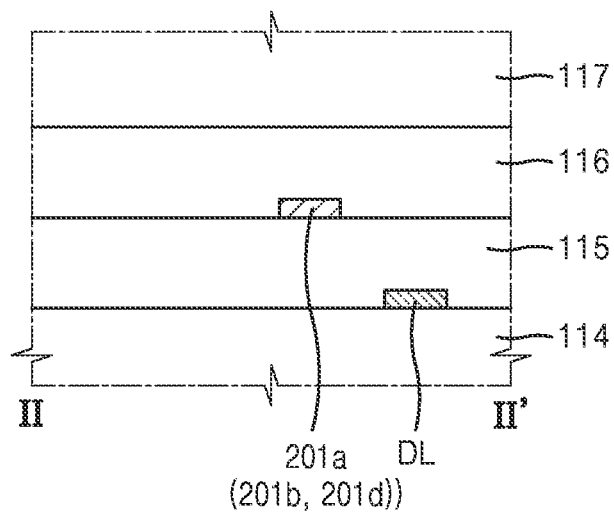

FIG. 9A is a schematic layout view of electrodes and wires according to some example embodiments. FIG. 9B is an enlarged view of an area E of FIG. 9A. FIGS. 10A to 10C are cross-sectional views taken along a line II-II' of FIG. 9A. Hereinbelow, the same reference numerals as those in FIG. 8 mean the same members.

Referring to FIGS. 9A to 10C, the semiconductor layer Act may be arranged on the buffer layer 111. The semiconductor layer Act may include amorphous silicon, polycrystalline silicon, or an organic semiconductor material. The semiconductor layer Act may have a curved shape in various shapes. As shown in FIG. 9B, the semiconductor layer Act may include a channel region 131*a* of the first transistor T1, a channel region 131*b* of the second transistor T2, channel regions 131*c*1 and 131*c*2 of the third transistor T3, channel regions 131*d*1 and 131*d*2 of the fourth transistor T4, a channel region 131*e* of the fifth transistor T5, a channel region 131*f* of the sixth transistor T6, and a channel region 131*g* of the seventh transistor T7. That is, the channel regions 131*a* to 131*g* of the first to seventh transistors T1 to T7 may be regions of the semiconductor layer Act. Because the channel region 131*a* of the first transistor T1 may be curved and thus be formed long, a driving range of a gate voltage applied to a gate electrode may be increased. The channel region 131*a* of the first transistor T1 may have a shape such as "⊏," "⊒," "M," "W," etc. Various embodiments are also possible. The channel region 131*g* of the seventh transistor T7 may be a region of a semiconductor layer extending from a previous row.

The semiconductor layer Act of the first to seventh transistors T1 to T7 may include a source region and a drain region on both sides of each of the channel regions 131*a* to 131*g*. As shown in FIGS. 9A and 9B, the semiconductor layer Act may include a source region 176*a* and a drain region 177*a* of the first transistor T1, a source region 176*b* and a drain region 177*b* of the second transistor T2, a source region 176*c* and a drain region 177*c* of the third transistor T3, a source region 176*d* and a drain region 177*d* of the fourth transistor T4, a source region 176*e* and a drain region 177*e* of the fifth transistor T5, a source region 176*f* and a drain region 177*f* of the sixth transistor T6, and a source region 176*g* and a drain region 177*g* of the seventh transistor T7. In some cases, the source regions or the drain regions may be construed as source electrodes or drain electrodes of transistors, respectively. That is, for example, a source electrode and a drain electrode of the first transistor T1 may correspond to the source region 176*a* and the drain region 177*a*, which are doped with impurities in the vicinity of the channel region 131*a* in the semiconductor layer Act shown in FIG. 9B, respectively. According to embodiments, locations of the source regions and the drain regions may be changed. The first insulating layer 112 may be located on the semiconductor layer Act.

A gate electrode 125*a* of the first transistor T1, a gate electrode 125*b* of the second transistor T2, gate electrodes 125*c*1 and 125*c*2 of the third transistor T3, gate electrodes 125*d*1 and 125*d*2 of the fourth transistor T4, a gate electrode 125*e* of the fifth transistor T5, a gate electrode 125*f* of the sixth transistor T6, and a gate electrode 125*g* of the seventh transistor T7 may be arranged on the first insulating layer 112. In addition, the first scan line 121, the second scan line 122, and the emission control line 123 may be arranged on the first insulating layer 112 to extend in the second direction D2. The first scan line 121, the second scan line 122, and the emission control line 123 may include the same material as and may be arranged on the same layer as the gate electrodes of the first to seventh transistors T1 to T7. The gate electrode 125*a* of the first transistor T1 may function as the lower electrode 125*h* of the capacitor Cst.

The gate electrode 125b of the second transistor T2 and the gate electrodes 125c1 and 125c2 of the third transistor T3 may be portions of the first scan line 121 intersecting with the semiconductor layer Act or portions protruding from the first scan line 121. The gate electrodes 125d1 and 125d2 of the fourth transistor T4 and the gate electrode 125g of the seventh transistor T7 may be portions of the second scan line 122 intersecting with the semiconductor layer Act or portions protruding from the second scan line 122. The gate electrode 125e of the fifth transistor T5 and the gate electrode 125f of the sixth transistor T6 may be portions of the emission control line 123 intersecting with the semiconductor layer Act or portions protruding from the emission control line 123. The gate electrode 125a of the first transistor T1 may be provided in an island type.

The gate electrodes 125a to 125g of the first to seventh transistors T1 to T7 may include a single layer or a multi-layer including one or more materials of Al, Pt, Pd, Ag, Mg, Au, Ni, Nd, Ir, Cr, Li, Ca, Mo, Ti, W, and Cu. The second insulating layer 113 may be arranged on the gate electrodes 125a to 125g of the first to seventh transistors T1 to T7.

The upper electrode 127 of the capacitor Cst may be arranged on the second insulating layer 113. An opening may be formed in the upper electrode 127 of the capacitor Cst. Through the opening, a node electrode 174 may allow the lower electrode 125h of the capacitor Cst to be electrically connected to the drain region 177c of the third transistor T3. The upper electrode 127 of the capacitor Cst may include a single layer or a multi-layer including one or more materials of Al, Pt, Pd, Ag, Mg, Au, Ni, Nd, Ir, Cr, Li, Ca, Mo, Ti, W, and Cu. The capacitor Cst may share the gate electrode 125a of the first transistor T1 as a lower electrode and may overlap the first transistor T1.

The initialization voltage line 124 and a shielding electrode 129 may be arranged on the second insulating layer 113 which is the same layer as the upper electrode 127 of the capacitor Cst. The initialization voltage line 124 and the shielding electrode 129 may include the same material as the upper electrode 127 of the capacitor Cst. The initialization voltage line 124 may extend in the second direction D2. The shielding electrode 129 may overlap the source region 176b of the second transistor T2 and the source/drain region 176c/177c of the third transistor T3. The shielding electrode 129 may overlap the source/drain region 176c/177c between the two channel regions 131c1 and 131c2 of the third transistor T3.

The third insulating layer 114 may be arranged on the upper electrode 127 of the capacitor Cst, the initialization voltage line 124, and the shielding electrode 129.

The first insulating layer 112, the second insulating layer 113, and the third insulating layer 114 may be an inorganic insulating layer including an inorganic material such as silicon oxide, silicon nitride, and/or silicon oxynitride.

The data line DL and the power voltage line PL extending in the first direction D1 may be arranged on the third insulating layer 114. The data line DL may be connected to the source region 176b of the second transistor T2 through a contact hole 164 formed in the first insulating layer 112, the second insulating layer 113, and the third insulating layer 114. The power voltage line PL may be connected to the source region 176e of the fifth transistor T5 through a contact hole 165 formed in the first insulating layer 112, the second insulating layer 113, and the third insulating layer 114. The power voltage line PL may be connected to the upper electrode 127 of the capacitor Cst through a contact hole 168 formed in the third insulating layer 114. The power voltage line PL may be connected to the shielding electrode 129 through a contact hole 169 formed in the third insulating layer 114. The power voltage line PL may include a protrusion 172a protruding from the power voltage line PL in an extension direction of the second scan line 122. The protrusion 172a of the power voltage line PL may overlap the second scan line 122. The protrusion 172a of the power voltage line PL may be arranged on a layer between the first connection line 201 and the second scan line 122, and may overlap the first connection line 201 and the second scan line 122, and thus electrical signal interference between the second scan line 122 and a portion (first portion 201a) of the first connection line 201 parallel to the second scan line 122 may be blocked, thereby reducing parasitic capacitance between the first connection line 201 and the second scan line 122.

The data line DL and the power voltage line PL may include Mo, Al, Cu, Ti, etc. and may include a multi-layer and a single layer. According to some example embodiments, the data line DL and the power voltage line PL may have a multi-layered structure of Ti/Al/Ti.

Various conductive layers may be further arranged on the third insulating layer 114. For example, the node electrode 174 and connection electrodes 173 may be further formed on the third insulating layer 114. One end of the node electrode 174 may be connected to the drain region 177c of the third transistor T3 and the drain region 177d of the fourth transistor T4 through a contact hole 166 formed in the first insulating layer 112, the second insulating layer 113, and the third insulating layer 114, and the other end of the node electrode 174 may be connected to the gate electrode 125a of the first transistor T1 through a contact hole 167 formed in the second insulating layer 113 and the third insulating layer 114. In this case, the other end of the node electrode 174 may be connected to the gate electrode 125a of the first transistor T1 through the opening formed in the upper electrode 127 of the capacitor Cst. One end of a connection electrode 173 may be connected to the initialization voltage line 124 through a contact hole 161 formed in the third insulating layer 114, and the other end of the connection electrode 173 may be connected to the source region 176d of the fourth transistor T4 through a contact hole 162 formed in the first insulating layer 112, the second insulating layer 113, and the third insulating layer 114. The connection electrode 173 may be connected to the drain region 177f of the sixth transistor T6 through a contact hole 163 formed in the first insulating layer 112, the second insulating layer 113, and the third insulating layer 114.

The node electrode 174 and the connection electrodes 173 may include Mo, Al, Cu, Ti, etc. and may include a multi-layer or a single layer. According to some example embodiments, the node electrode 174 and the connection electrodes 173 may have a multi-layered structure of Ti/Al/Ti.

The fourth insulating layer 115 may be arranged on the data line DL and the power voltage line PL. The first connection line 201 may be arranged on at least one of the third insulating layer 114 or the fourth insulating layer 115.

As described above, the first connection line 201 may include the first portion 201a extending in the first direction D1 and the second portion 201b extending in the second direction D2. In addition, the first connection line 201 may further include a fourth portion 201d connecting the first portion 201a to the second portion 201b. In this case, the fourth portion 201d may extend in a direction between the first direction D1 and the second direction D2. That is, as shown in FIG. 9A, the fourth portion 201d may be arranged in a diagonal direction with respect to the first direction D1 or the second direction D2. However, when there is a space, the fourth portion 201d may not be arranged, and the first portion 201a and the second portion 201b may overlap each other. In this case, the first portion 201a and the second portion 201b may be perpendicular to each other. However, hereinbelow, for convenience of description, a case where the first connection line 201 includes the fourth portion 201d will be mainly described in detail.

The fourth portion 201d may be formed as one body with at least one of the first portion 201a or the second portion 201b. In this case, the fourth portion 201d may be bent extending from one of the first portion 201a and the second portion 201b.

The first portion 201a and the second portion 201b as described above may be arranged on different layers or may be arranged on the same layer. According to some example embodiments, when the first portion 201a and the second portion 201b are arranged on different layers, the first portion 201a and the second portion 201b may be connected to each other through a second contact portion CNT2. In this case, the second contact portion CNT2 may be in the form of a contact hole. According to some example embodiments, when the first portion 201a and the second portion 201b are arranged on different layers, the first portion 201a and the second portion 201b may be formed as one body and connected to each other.

The first portion 201a and the second portion 201b as described above may be arranged at various positions. For example, the first portion 201a may be arranged between an emission control line 123 providing an emission control signal to one of pixels PX adjacent to each other and an initialization voltage line 124 providing an initialization voltage to the other pixels PX adjacent to each other. In this case, in a plan view, at least a portion of the first portion 201a may not overlap the emission control line 123 and the initialization voltage line 124, which are adjacent to each other. In addition, at least the portion of the first portion 201a may or may not overlap a pixel electrode 131 of one of the pixels PX adjacent to each other. In a plan view, when at least the portion of the first portion 201a overlaps the pixel electrode 131 of one of the pixels PX adjacent to each other, the first portion 201a may be arranged on a different layer from the pixel electrode 131 and may not be connected to the pixel electrode 131. In addition, the first portion 201a may be arranged on a different layer from the data line DL. In this case, the first portion 201a may not be connected to a second data line DL2 arranged in the second data line arrangement area DLA2 and may be connected to only one first data line DL1 arranged in the first data line arrangement area DLA1 through the first contact portion CNT1.

At least one of the first portions 201a as described above may be arranged to intersect with one of the scan lines SL in a plan view. In this case, the first portion 201a and the scan line SL may be arranged on different layers and thus may not be connected to each other. For example, one first portion 201a may be arranged to intersect with one of the first scan line 121 and the second scan line 122 in a plan view.

The second portion 201b may be arranged to be spaced apart from the data line DL. At this time, the second portion 201b may be arranged on a layer on which the data line DL is arranged or on a layer on which the data line DL is not arranged. In this case, when the second portion 201b is arranged on the same layer as the data line DL, the second portion 201b may be spaced apart from the data line DL and thus may not be connected to the data line DL. In addition, the second portion 201b may be arranged to be parallel to the data line DL. According to some example embodiments, when the second portion 201b is arranged on a different layer from the data line DL, the second portion 201b may be arranged on the data line DL to at least partially overlap the second portion 201b.

The arrangement of the first connection line 201 and the data line DL as described above will be described in detail below.

Referring to FIG. 10A, when the data line DL is arranged on the third insulating layer 114, the first portion 201a may be arranged on the fourth insulating layer 115 on which the data line DL is not arranged, and the second portion 201b may be arranged on the third insulating layer 114 on which the data line DL is arranged. In this case, the second portion 201b may be spaced apart from the data line DL on the third insulating layer 114. In particular, the second portion 201b may be arranged to be parallel to the data line DL in a plan view. In this case, an end of the first portion 201a and an end of the second portion 201b may overlap each other in a plan view and may be connected to each other through the second contact portion CNT2. According to some example embodiments, one of the end of the first portion 201a and the end of the second portion 201b may overlap the fourth portion 201d and may be connected to each other through the second contact portion CNT2.

Referring to FIG. 10B, when the data line DL is arranged on the fourth insulating layer 115, the first portion 201a may be arranged on the third insulating layer 114 on which the data line DL is not arranged, and the second portion 201b may be arranged on the fourth insulating layer 115 on which the data line DL is arranged. At this time, the second portion 201b may be spaced apart from the data line DL on the fourth insulating layer 115. In this case, the end of the first portion 201a and the end of the second portion 201b may overlap each other in a plan view and may be connected to each other through the second contact portion CNT2. According to some example embodiments, one of the end of the first portion 201a and the end of the second portion 201b may overlap the fourth portion 201d and may be connected to each other through the second contact portion CNT2.

Referring to FIG. 10C, the first portion 201a and the second portion 201b may be arranged on the fourth insulating layer 115 on which the data line DL is not arranged. In this case, the data line DL may be arranged on the third insulating layer 114. According to some example embodiments, when the data line DL is arranged on the fourth insulating layer 115, the first portion 201a and the second portion 201b may be arranged on the third insulating layer 114. According to some example embodiments, when the first connection line 201 includes the fourth portion 201d, the first portion 201a, the second portion 201b, and the fourth portion 201d may be arranged on the third insulating layer 114 or the fourth insulating layer 115 according to a shape in which the data line DL is arranged. In the case described above, the first connection line 201 may be formed as one body For example, the first portion 201a, the second portion 201b, and the fourth portion 201d may be formed as one body.

In the case described above, a first connection line 201 connected to the first data line DL1 arranged in the first data line arrangement area DLA1 may meet once a scan line SL (e.g., at least one of the first scan line 121 or the second scan line 122) which is connected to pixels PX arranged in a line among the pixels PX and is configured to transmit a scan signal to each of the pixels PX arranged in a line.

In the case described above, in a case where each scan signal is applied when each pixel PX is driven, parasitic capacitance is generated between each scan line SL and the first connection line 201 according to a change in voltages of the scan signal applied to each scan line SL, which may cause coupling between each scan line SL and the first connection line 201. In addition, when lengths of portions of the first connection line 201, which are arranged parallel to the same scan line SL, are increased, a data signal transmitted through the first connection line 201 may include noise due to parasitic capacitance between the scan line SL and the portions of the first connection line 201, which are parallel to each other. In this case, the first data line DL1 connected to the first connection line 201 does not transmit an accurate signal to each pixel PX connected to the first data line DL1, and thus, a luminance of each pixel PX connected to the first data line DL1 may be lowered. In addition, when the first connection line 201 is arranged in a straight line or is arranged to pass through pixel electrodes 131 of a number of pixels PX, a signal (or voltage) passing through the first connection line 201 may vary according to an operation of the pixel electrode 131 of each pixel PX.

However, by arranging the first connection line 201 alternately in the first direction D1 and the second direction D2 as described above, a length in which the first connection line 201 overlaps each scan line SL may be minimized. In addition, when one scan line SL (e.g., one of the first scan line 121 and the second scan line 122, or one of the scan lines SL) is operated, the other scan line SL (e.g., the other of the first scan line 121 and the second scan line 122, or the other of the scan lines SL) is not operated, and thus the influence of the scan lines SL on the signal passing through the first connection line 201 may be minimized.

Therefore, the display panel does not affect a data signal transmitted to the first data line DL1 through the first connection line 201, and thus, a luminance of a pixel PX in an area in which the first data line DL1 is arranged may be accurately controlled.

Figure 11:
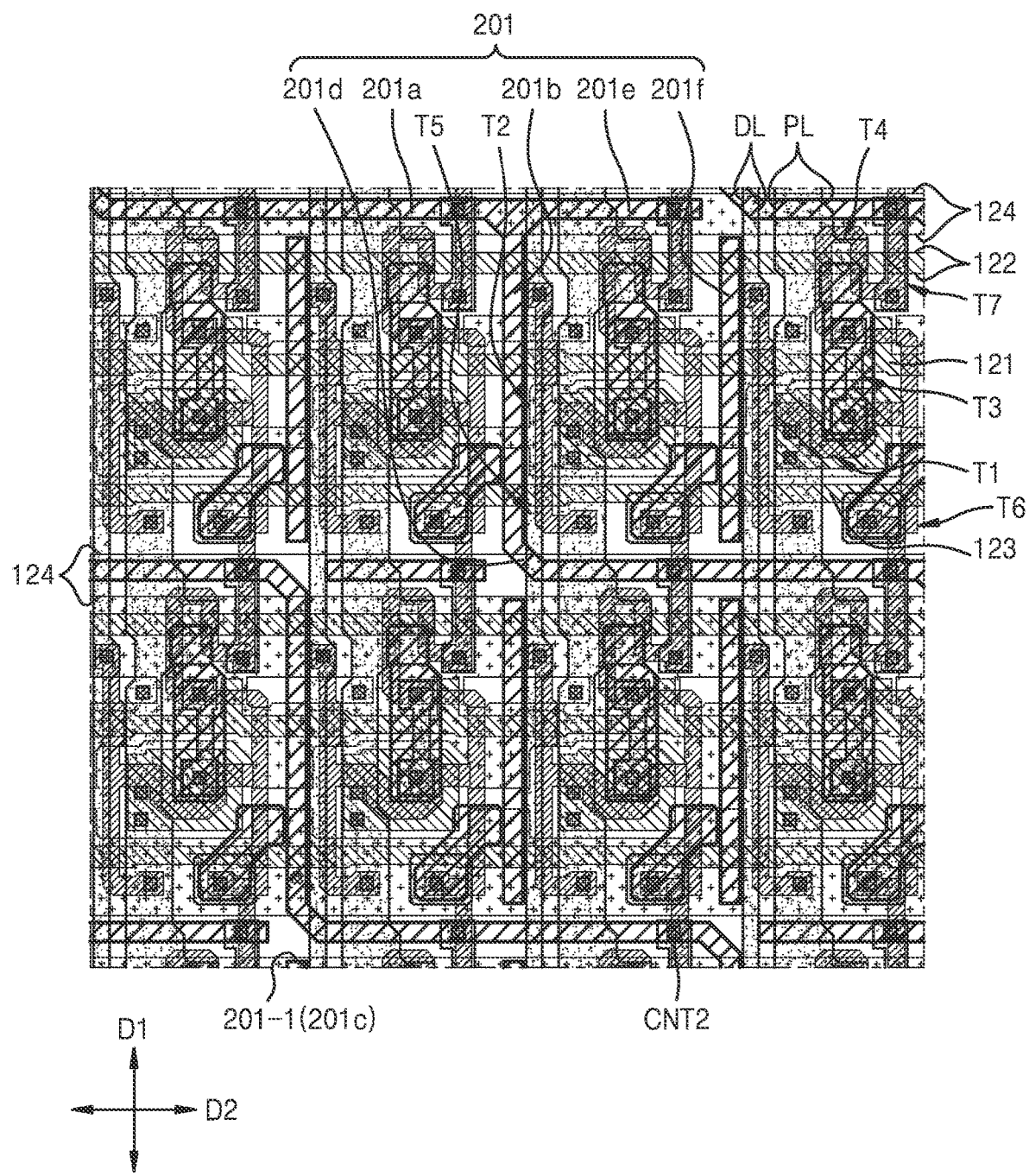
FIG. 11 is a schematic layout view of electrodes and wires according to some example embodiments.

FIG. 11 is a schematic layout view of electrodes and wires according to some example embodiments.

Referring to FIG. 11, the first connection line 201 may include the first portion 201a, the second portion 201b, and the third portion 201c. In this case, the first portion 201a and the second portion 201b may be the same as or similar to those described above. The first portion 201a and the second portion 201b may be arranged on different layers and connected to each other through the second contact portion CNT2. According to some example embodiments, the first portion 201a and the second portion 201b may be arranged on the same layer and formed as one body. Hereinbelow, for convenience of description, a case where the first portion 201a and the second portion 201b are arranged on different layers and connected to each other through the second contact portion CNT2 will be mainly described in detail.

In a plan view, each first portion 201a may be arranged to cross only some of the data lines DL and may not cross the others of the data lines DL. For example, when ten data lines DL are arranged, one first portion 201a may pass through only two of the ten data lines DL, and another first portion 201a may pass through only another two of the ten data lines DL. In this case, the first portion 201a is arranged on a different layer from each data line DL, and thus may not be connected to each data line DL. At this time, the data lines DL crossed by each first portion 201a in a plan view are not limited to the above description.

The first portion 201a as described above may be arranged in each pixel PX and may be arranged between an emission control line 123 and an initialization voltage line 124, which are adjacent to each other. In particular, the first portion 201a may be arranged between an emission control line 123 connected to one of the pixels PX adjacent to each other and an initialization voltage line 124 connected to the other of the pixels PX adjacent to each other. In this case, the first portion 201a may be arranged parallel to the scan line SL. In addition, as described above, the first portion 201a may or may not overlap pixel electrodes 131 of some of the pixels PX arranged in a line in a plan view. In this case, in a plan view, when the first portion 201a does not overlap the pixel electrode 131, the first portion 201a may be arranged between a pixel electrode 131 of one of the pixels PX adjacent to each other and an initialization voltage line 124 of the other pixels PX adjacent to each other.

The second portion 201b may be arranged in a different direction from the first portion 201a. In this case, the second portion 201b may be arranged to be parallel to the data line DL. In this case, the second portion 201b may pass through at least one scan line SL. In particular, the second portion 201b may pass through one scan line SL. In this case, the second portion 201b may pass through a first scan line 121 and a second scan line 122, which are connected to one pixel PX. According to some example embodiments, the second portion 201b may be arranged to pass only some of the scan lines SL. In particular, in this case, one of different second portions 201b may pass through some of the scan lines SL, and another of the different second portions 201b may pass through the others of the scan lines SL. That is, a second portion 201b of one of the first connection lines 201 may pass through only some of the scan lines SL.

In the case described above, the first portion 201a and the second portion 201b may be arranged as shown in FIGS. 10A to 10C.

The first connection line 201 may include a dummy connection line 201-1 including only the third portion 201c. In this case, the dummy connection line 201-1 may be connected to a pad, and an end of the dummy connection line 201-1 may not be connected to other wires.

The first connection line 201 may include a branch portion 201e. The branch portion 201e may extend from at least one of the first portion 201a or the second portion 201b. In this case, an end of the branch portion 201e may not be connected to other wires.

The first connection line 201 may further include a dummy line 201f. The dummy line 201f may be spaced apart from the first portion 201a and the second portion 201b, and may also be spaced apart from the branch portion 201e and the dummy connection line 201-1. The first connection line 201 as described above may not include a separate dummy pattern.

Therefore, the display panel does not affect the data signal transmitted to the first data line DL1 through the first connection line 201, and thus the luminance of the pixel PX in the area in which the first data line DL1 is arranged may be accurately controlled.

Figure 12:
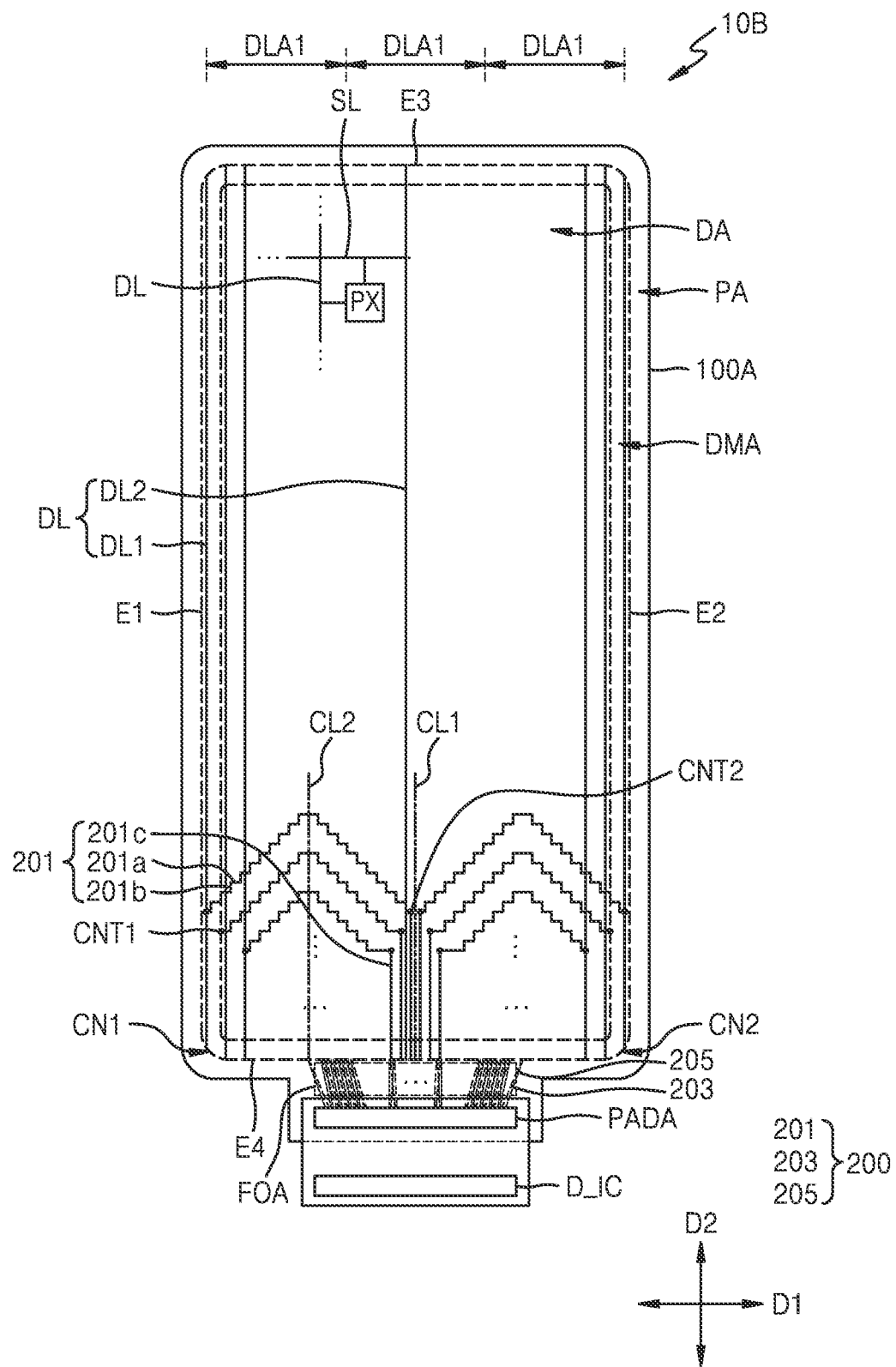
FIG. 12 is a schematic plan view of an example of a display panel according to some example embodiments.

FIG. 12 is a schematic plan view of an example of a display panel 10B according to some example embodiments.

The arrangement of the first connection lines 201 in the display panel 10B is different from the arrangement of the first connection lines 201 in the display panel 10A of FIG. 1, and the other configurations are the same. Hereinbelow, configurations different from those of FIG. 1 will be mainly described.

Referring to FIG. 12, at least a portion of each first connection line 201 may be located on a different layer from the scan lines SL and the data lines DL of the pixels PX. One end of the first connection line 201 may be connected to the first data line DL1, and the other end of the first connection line 201 may be connected to the second connection line 203. One end of the first connection line 201 may be connected to the first data line DL1. For example, the second portion 201b of the first connection line 201 may be connected to the first data line DL1 at the first contact portion CNT1 located in the dummy area DMA.

The third portion 201c of the first connection line 201 may be connected to the second connection line 203. According to some example embodiments, the second connection line 203 may be a portion in which the third portion 201c of the first connection line 201 extends to the peripheral area PA through the dummy area DMA. One end of the second connection line 203 may be connected to the other end of the first connection line 201, and the other end of the second connection line 203 may be located in the pad area PADA. The other end of the second connection line 203 may be connected to a pad arranged in the pad area PADA.

One end of the third connection line 205 may be connected to the second data line DL2, and the other end of the third connection line 205 may be located in the pad area PADA. One end of the third connection line 205 may be connected to the second data line DL2 in the peripheral area PA or the dummy area DMA. The third connection line 205 may be a portion in which the second data line DL2 extends to the peripheral area PA through the dummy area DMA.

Similarly, the first connection lines 201 may be located on different layers from the scan lines SL and the data lines DL of the pixels PX. One end of the first connection line 201 may be connected to the first data line DL1, and the other end of the first connection line 201 may be connected to the second connection line 203. One end of the first connection line 201 may be connected to the first data line DL1 in the dummy area DMA located at the second corner CN2. That is, the second portion 201b of the first connection line 201 may be connected to the first data line DL1 at the second contact portion CNT2 located in the dummy area DMA.

The first data lines DL1 are data lines arranged adjacent to the first corner CN1 and the second corner CN2 among the data lines DL. The second data lines DL2 are data lines other than the first data lines DL1 among the data lines DL, that is, data lines that are not connected to the first connection lines 201.

The first connection lines 201 and the second connection lines 203 may connect first data lines DL1 arranged on the left side of a second central line CL2 to the pads in the pad area PADA. In this case, the first connection lines 201 and the second connection lines 203 may be arranged to be bilaterally symmetrical to the display area DA with respect to the first central line CL1. Because the first connection lines 201 are arranged in the display area DA and connect the first data lines DL1 to the second connection lines 203, the peripheral area PA around the first corner CN1 and the second corner CN2 may be minimized, and thus, a dead area may be reduced in the first corner CN1 and the second corner CN2 without a reduction in the display area DA.

First data lines DL1 of which one ends are located at the first corner CN1 may be connected to the first connection lines 201 and electrically connected to the second connection lines 203. First data lines DL1 of which one ends are located at the second corner CN2 may be connected to the first connection lines 201 and electrically connected to the second connection lines 203. Second data lines DL2 spaced a certain distance from the first corner CN1 and the second corner CN2 may be directly connected to the third connection lines 205.

A portion of a first connection line 201, which is farthest from the pad area PADA in the second direction D2 as described above, among the first connection lines 201 may be arranged between the first central line CL1 and the first data line DL1 connected to the first connection line 201. For example, the first connection line 201 may be arranged to be symmetrical to each other with respect to the second central line CL2. In this case, the portion of the first connection line 201, which is farthest from the pad area PADA, may be arranged on the second central line CL2. According to some example embodiments, the portion of the first connection line 201, which is farthest from the pad area PADA, may be arranged between the first central line CL1 and the second central line CL2 or between the second central line CL2 and the data line DL connected to the first central line CL1, which are shown in FIG. 12. Hereinbelow, for convenience of description, a case where the first connection lines 201 are symmetrical with respect to the second central line CL2 will be mainly described in detail.

Each portion of the first connection lines 201 arranged on both sides with respect to the second central line CL2 may extend, as the first portion 201a parallel to the scan line SL and the second portion 201b parallel to the data line DL alternate with each other. In this case, first connection lines 201 symmetrical to the first connection lines 201 with respect to the first central line CL1 may have the same structure as the first connection lines 201. The first portions 201a of the first connection lines 201 may extend parallel to the scan line SL at a first length corresponding to an interval between two adjacent data lines DL. The second portions 201b of the first connection lines 201 may extend parallel to the data line DL at a second length corresponding to an interval between two adjacent scan lines SL. The first portions 201a of the first connection lines 201 may overlap with or be adjacent to scan line SL. The second portions 201b of the first connection lines 201 may overlap with or be adjacent to the data line DL.

Each portion of the first connection lines 201 arranged on both sides with respect to the second central line CL2 may overall extend in a zigzag manner in a diagonal direction between the first direction D1 and the second direction D2, as the first portion 201a and the second portion 201b repeat. That is, the first connection lines 201 may overlap scan lines SL in a plurality of rows and overlap data lines DL in a plurality of columns.

The pixels PX may be connected to the scan line SL in each row, and the pixels PX may simultaneously (or concurrently) receive a scan signal. As the first portion 201a of the first connection line 201 extends parallel to one scan line SL at a length n times a distance between adjacent data lines DL, parasitic capacitance may be formed between the first portion 201a of the first connection line 201 and the scan line SL, thereby causing coupling therebetween. Accordingly, a data signal transmitted to the data line DL connected to the first connection line 201 is changed, and thus deterioration in image quality due to oblique spots may occur.

The first connection lines 201 may extend in a zigzag manner through the pixels PX in the rows and columns. That is, the first portions 201a of the first connection lines 201 are located in different rows, and thus, a length in which the first portion 201a overlaps the scan line SL in each row may be reduced than a case where the first connection lines 201 are formed in a straight line. A scan signal is applied to the scan lines SL arranged in different rows at different timings, and parasitic capacitance between the first connection lines 201 and the scan lines SL is distributed to the rows and thus may be reduced. Therefore, the influence of the scan lines SL on the data signal is minimized, and thus deterioration in image quality due to oblique spots may be prevented.

Figure 13:
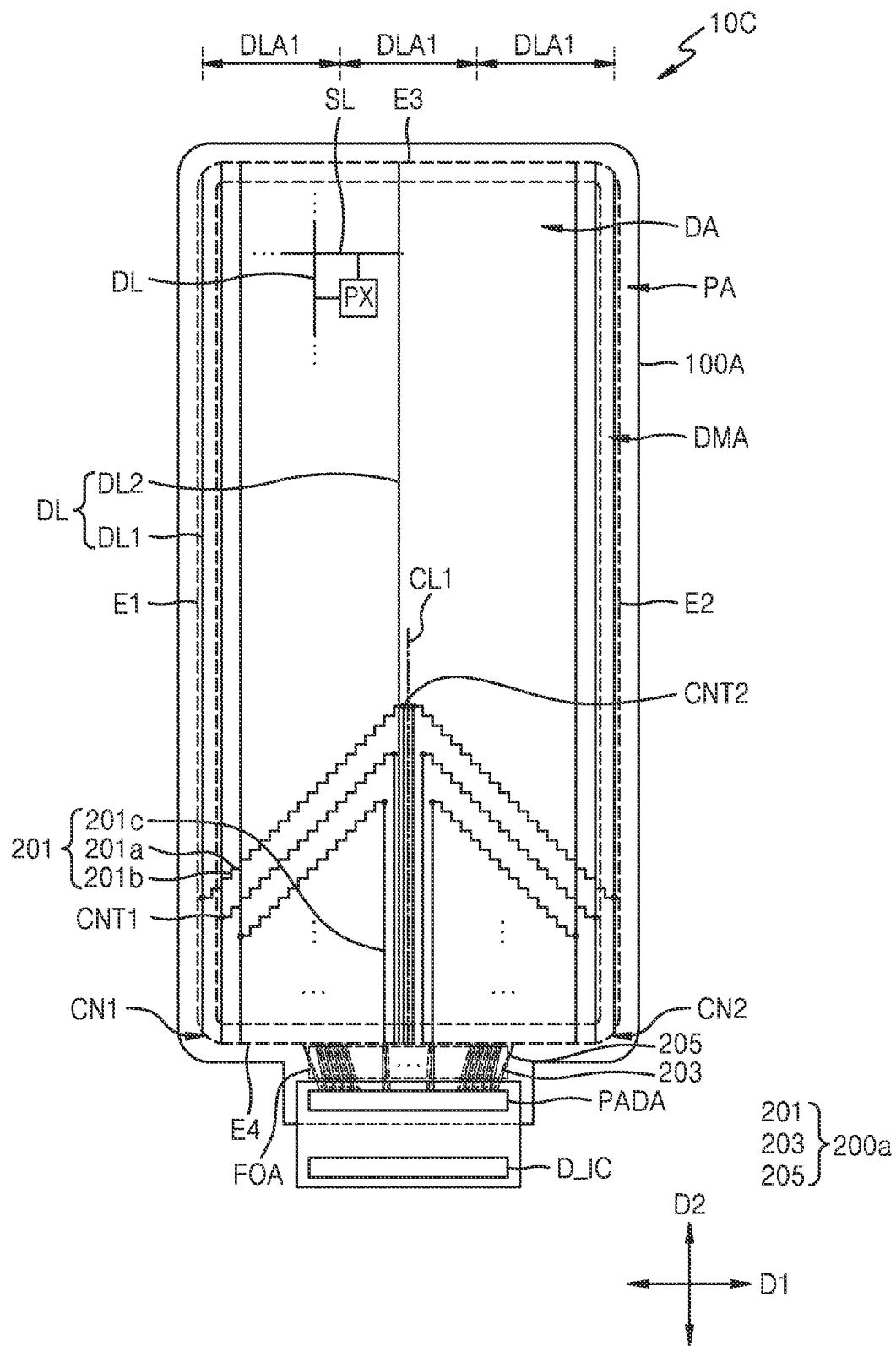
FIG. 13 is a schematic plan view of an example of a display panel according to some example embodiments.

FIG. 13 is a schematic plan view of an example of a display panel 10C according to some example embodiments.

The arrangement of the first connection lines 201 in the display panel 10C of FIG. 13 is different from the arrangement of the first connection lines 201 in the display panel 10A of FIG. 1, and the other configurations are the same. Hereinbelow, configurations different from those of FIG. 1 will be mainly described.

Referring to FIG. 13, the first connection lines 201 may be located on different layers from the scan lines SL and the data lines DL of the pixels PX. One end of the first connection line 201 may be connected to the first data line DL1, and the other end of the first connection line 201 may be connected to the second connection line 203. One end of the first connection line 201 may be connected to the first data line DL1. For example, the second portion 201b of the first connection line 201 may be connected to the first data line DL1 at the first contact portion CNT1 located in the dummy area DMA.

The first portion 201a and the third portion 201c of the first connection line 201 may be connected to the second connection line 203. According to some example embodiments, the second connection line 203 may be a portion in which the first portion 201a or the third portion 201c of the first connection line 201 extends to the peripheral area PA through the dummy area DMA. One end of the second connection line 203 may be connected to the other end of the first connection line 201, and the other end of the second connection line 203 may be located in the pad area PADA. The other end of the second connection line 203 may be connected to a pad arranged in the pad area PADA.

One end of the third connection line 205 may be connected to the second data line DL2, and the other end of the third connection line 205 may be located in the pad area PADA. The other end of the third connection line 205 may be connected to a pad arranged in the pad area PADA. One end of the third connection line 205 may be connected to the second data line DL2 in the peripheral area PA or the dummy area DMA. The third connection line 205 may be a portion in which the second data line DL2 extends to the peripheral area PA through the dummy area DMA.

Similarly, the first connection lines 201 may be located on different layers from the scan lines SL and the data lines DL of the pixels PX. One end of the first connection line 201 may be connected to the first data line DL1, and the other end of the first connection line 201 may be connected to the second connection line 203. One end of the first connection line 201 may be connected to the first data line DL1 in the dummy area DMA located at the second corner CN2. That is, the second portion 201b of the first connection line 201 may be connected to the first data line DL1 at the second contact portion CNT2 located in the dummy area DMA.

The first data lines DL1 are data lines arranged adjacent to the first corner CN1 and the second corner CN2 among the data lines DL. The second data lines DL2 are data lines other than the first data lines DL1 among the data lines DL, that is, data lines that are not connected to the first connection lines 201.

The first connection lines 201 and the second connection lines 203 may connect first data lines DL1 arranged on the left side of the first central line CL1 to the pads in the pad area PADA. In this case, the first connection lines 201 and the second connection lines 203 may be arranged to be bilaterally symmetrical to the display area DA with respect to the first central line CL1. Because the first connection lines 201 are arranged in the display area DA and connect the first data lines DL1 to the second connection lines 203, the peripheral area PA around the first corner CN1 and the second corner CN2 may be minimized, and thus, a dead area may be reduced in the first corner CN1 and the second corner CN2 without a reduction in the display area DA.

The first data lines DL1 of which one ends are located at the first corner CN1 may be connected to the first connection lines 201 and electrically connected to the second connection lines 203. The first data lines DL1 of which one ends are located at the second corner CN2 may be connected to the first connection lines 201 and electrically connected to the second connection lines 203. The second data lines DL2 spaced a certain distance from the first corner CN1 and the second corner CN2 may be directly connected to the third connection lines 205.

The first connection lines 201 as described above may be formed as opposed to that shown in FIG. 1. For example, the first connection line 201 may include the first portion 201a extending in the first direction D1, the second portion 201b extending in the second direction D2, and the third portion 201c connecting the first connection line 201 to the second connection line 203.

In this case, the first portion 201a and the second portion 201b may be alternately repeated and connected to each other. At this time, a first portion 201a connected to the third portion 201c may be arranged at a distance farthest from the pad area PADA, compared to other first portions 201a arranged in other areas. In addition, a first portion 201a connected to the first contact portion CNT1 may be arranged at a distance closest to the pad area PADA. In the case described above, a portion of the first connection line 201, which is closest to the first central line CL1, may be farthest from the pad area PADA, compared to other portions of the first connection line 201.

The first connection lines 201 as described above may be arranged to be symmetrical with respect to the first central line CL1. In this case, the first connection lines 201 may have a shape similar to the shape shown in FIGS. 9A and 9B. In addition, the first connection lines 201 may be arranged in the shape shown in FIGS. 10A to 10C.

Accordingly, in the display panel 10C, a scan signal is applied to the scan lines SL arranged in different rows at different timings, and parasitic capacitance between the first connection lines 201 and the scan lines SL is distributed to the rows and thus may be reduced. Therefore, the influence of the scan lines SL on the data signal is minimized, and thus deterioration in image quality due to oblique spots may be prevented.

Figure 14:
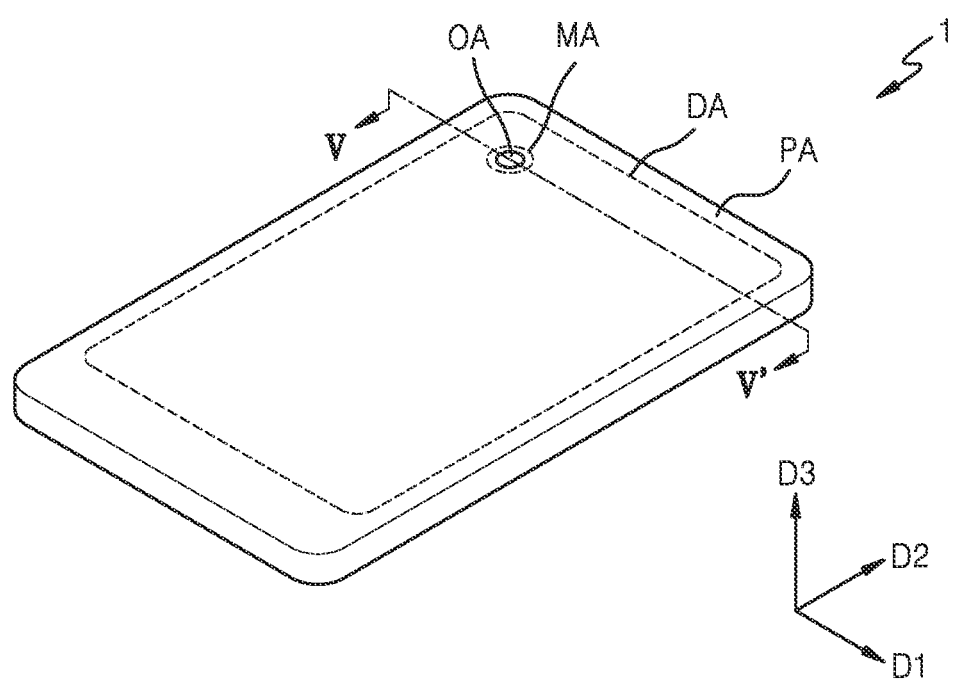
FIG. 14 is a perspective view of a display device including a display panel according to some example embodiments.
Figure 15A:
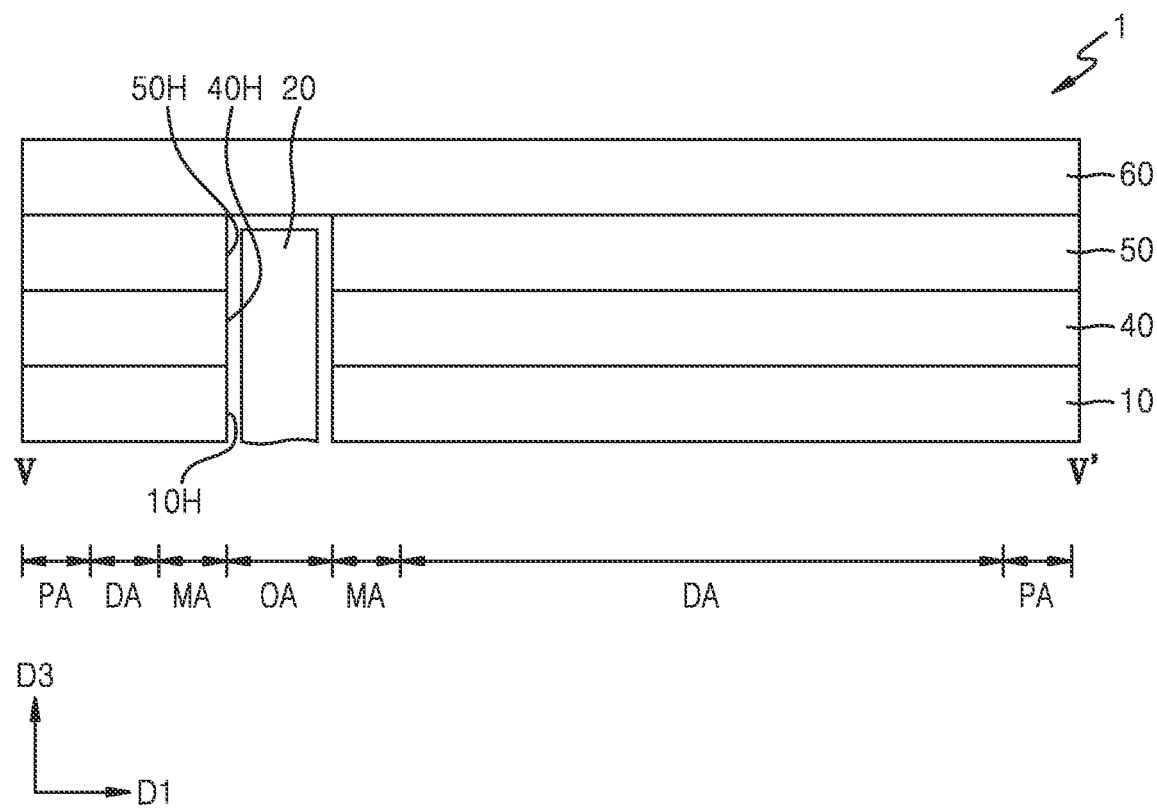
FIGS. 15A and 15B are cross-sectional views of the display device taken along a line V-V'.
Figure 15B:
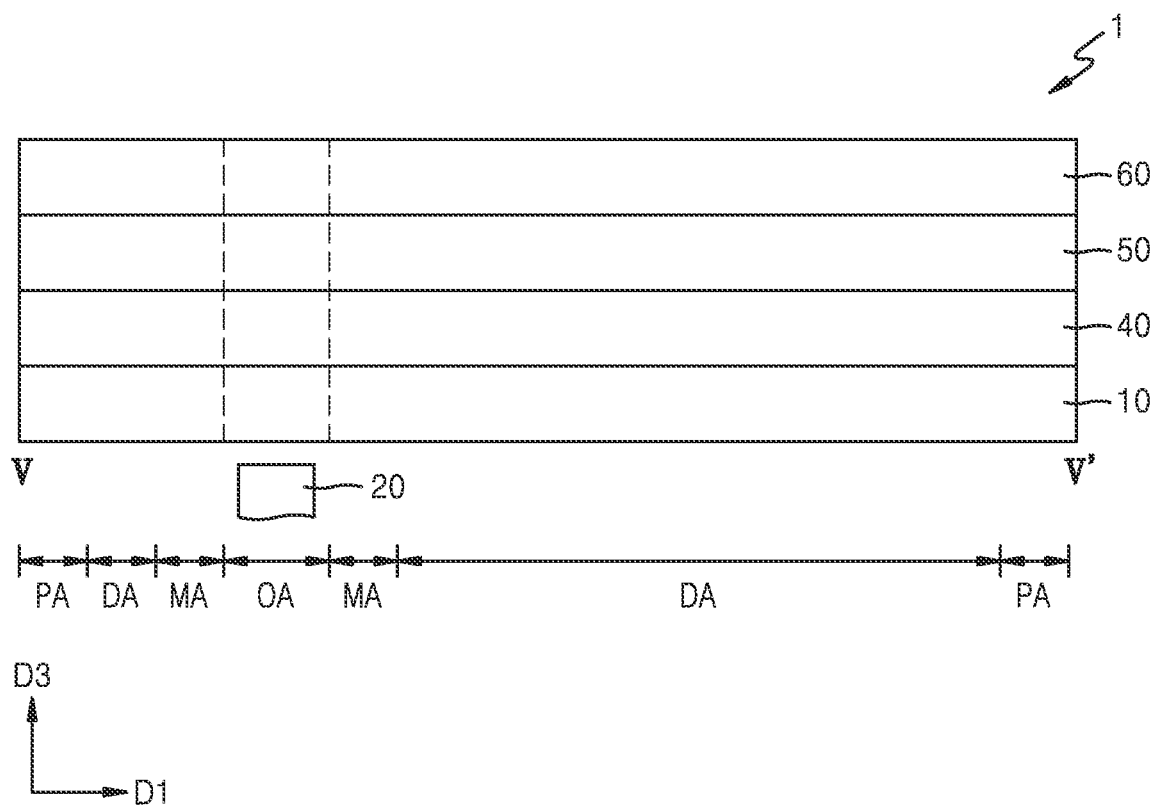

FIG. 14 is a perspective view of a display device 1 including a display panel according to some example embodiments. FIGS. 15A and 15B are cross-sectional views of the display device 1 taken along a line V-V'.

Referring to FIGS. 14 to 15B, the display device 1 may include a transmission area OA, a display area DA, an intermediate area MA between the transmission area OA and the display area DA, and a peripheral area PA surrounding the display area DA. The display device 1 may provide a certain image by using light emitted from a plurality of pixels arranged in the display area DA. FIG. 14 illustrates that one transmission area OA is arranged inside the display area DA, and the transmission area OA may be entirely surrounded by the display area DA. The transmission area OA may be an area in which a component to be described later with reference to FIGS. 15A and 15B is arranged. According to some example embodiments, the transmission area OA may be a transmission area in which holes through at least one element of the display device 1 is formed. According to some example embodiments, the transmission area OA may be a transmission area in which at least one element of the display device 1 does not include a hole.

The intermediate area MA may be arranged between the transmission area OA and the display area DA, and the display area DA may be surrounded by the peripheral area PA. The intermediate area MA and the peripheral area PA may be non-display areas in which pixels are not arranged. The intermediate area MA may be entirely surrounded by the display area DA, and the display area DA may be entirely surrounded by the peripheral area PA.

Referring to FIG. 15A, the display device 1 may include a display panel 10, an input sensing layer 40 arranged on the display panel 10, and an optical functional layer 50, which may be covered by a window 60. The display device 1 may be various types of electronic devices such as mobile phones, laptop computers, and smartwatches.

The display panel 10 may be the display panel 10A shown in FIG. 1, the display panel 10B shown in FIG. 12, and the display panel 10C shown in FIG. 13. The display panel 10 will be described later with reference to FIGS. 17A to 17D.

The input sensing layer 40 may be located on the display panel 10. The input sensing layer 40 may obtain coordinate information according to an external input, for example, a touch event. The input sensing layer 40 may include a sensing electrode (or touch electrode) and trace lines connected to the sensing electrode. The input sensing layer 40 may sense an external input using a mutual capacitance method and/or a self-capacitance method.

The input sensing layer 40 may be directly formed on the display panel 10 or may be separately formed and then coupled to the display panel 10 through an adhesive layer such as an optical clear adhesive. For example, the input sensing layer 40 may be continuously formed after a process of forming the display panel 10, in which case, the input sensing layer 40 may be understood as a portion of the display panel 10, and an adhesive layer may not be between the input sensing layer 40 and the display panel 10. Though FIG. 15A illustrates that the input sensing layer 40 is between the display panel 10 and the optical functional layer 50, according to some example embodiments, the input sensing layer 40 may be arranged on the optical functional layer 50.

The optical functional layer 50 may include a reflection prevention layer. The reflection prevention layer may reduce reflectance of light (external light) incident from the outside toward the display panel 10 through the window 60. The reflection prevention layer may include a retarder and a polarizer. The retarder may include a film-type retarder or a liquid crystal-type retarder, and may include a λ/2 retarder and/or a λ/4 retarder. The polarizer may include a film-type polarizer or a liquid crystal-type polarizer. The film-type polarizer may include a stretchable synthetic resin, and the liquid crystal-type polarizer may include liquid crystals arranged in a certain arrangement. The retarder and the polarizer each may further include a protection film. The protection films of the retarder and the polarizer may be defined as a base layer of the reflection prevention layer.

According to some example embodiments, the reflection prevention layer may include a black matrix and color filters. The color filters may be arranged considering colors of light emitted from each of the pixels of the display panel 10. Each of the color filters may include a red, green, or blue pigment or dye. Alternatively, each of the color filters may further include quantum dots other than the aforementioned pigment or dye. Alternatively, some of the color filters may not include the aforementioned pigment or dye, and may include scattering particles such as titanium oxide.

According to some example embodiments, the reflection prevention layer may include a destructive interference structure. The destructive interference structure may include a first reflection layer and a second reflection layer arranged on different layers. A first reflected light and a second reflected light reflected respectively from the first reflection layer and the second reflection layer may destructively interfere with each other, and thus reflectance of external light may be reduced.

The optical functional layer 50 may include a lens layer. The lens layer may improve light output efficiency of light emitted from the display panel 10 or reduce color deviation. The lens layer may include a layer having a concave or convex lens shape, and/or a plurality of layers having different refractive indices. The optical functional layer 50 may include all of the aforementioned reflection prevention layer and the lens layer, or may include any one of the reflection prevention layer and the lens layer.

According to some example embodiments, the optical functional layer 50 may be continuously formed after a process of forming the display panel 10 and/or the input sensing layer 40. In this case, an adhesive layer may not be between the optical functional layer 50 and the display panel 10 and/or between the display panel 10 and the input sensing layer 40.

The display panel 10, the input sensing layer 40, and/or the optical functional layer 50 each may include an opening. In this regard, FIG. 15A illustrates that the display panel 10, the input sensing layer 40, and the optical functional layer 50 include a first opening 10H, a second opening 40H, and a third opening 50H, respectively, and the first to third openings 10H, 40H, and 50H overlap each other. The first to third openings 10H, 40H, and 50H may be located to correspond to a first area OA. According to some example embodiments, one or more of the display panel 10, the input sensing layer 40, and the optical functional layer 50 may not include openings. For example, any one or two elements selected from among the display panel 10, the input sensing layer 40, and the optical functional layer 50 may not include openings. Alternatively, the display panel 10, the input sensing layer 40, and the optical functional layer 50 may not all include openings as shown in FIG. 15B.

As described above, the transmission area OA may be a component area (e.g., a sensor area, a camera area, a speaker area, etc.) in which a component 20 for adding various functions to the display device 1 is located. The component 20 may be located in the first to third openings 10H, 40H, and 50H as shown in FIG. 15A. Alternatively, the component 20 may be located under the display panel 10 as shown in FIG. 15B.

The component 20 may include an electronic element. For example, the component 20 may be an electronic element using light or sound. For example, the electronic element may be a sensor that outputs and/or receives light, such as an infrared sensor, a camera that captures an image by receiving light, a sensor that measures a distance or recognizes a fingerprint by outputting and sensing light or sound, a small lamp that outputs light, a speaker that outputs sound, etc. The electronic element using light may use light in various wavelength bands such as visible light, infrared light, ultraviolet light, etc. In some embodiments, the first area OA may be understood as a transmission area through which light and/or sound output from the component 20 to the outside or traveling toward the electronic element from the outside may be transmitted.

According to some example embodiments, when the display device 1 is used as a smartwatch or an instrument panel for a vehicle, the component 20 may be a member such as clock hands or needles indicating certain information (e.g., vehicle speed, etc.). When the display device 1 includes clock hands or an instrument panel for a vehicle, the component 20 may be exposed to the outside through the window 60, and the window 60 may include an opening corresponding to the first area OA.

The component 20 may include element(s) related to the functions of the display panel 10 as described above or may include elements such as accessories that improve the aesthetics of the display panel 10. According to some example embodiments, an optical clear adhesive or the like may be between the window 60 and the optical functional layer 50.

FIGS. 16A to 16D are schematic cross-sectional views of a display panel 10 according to some example embodiments.

Figure 16A:
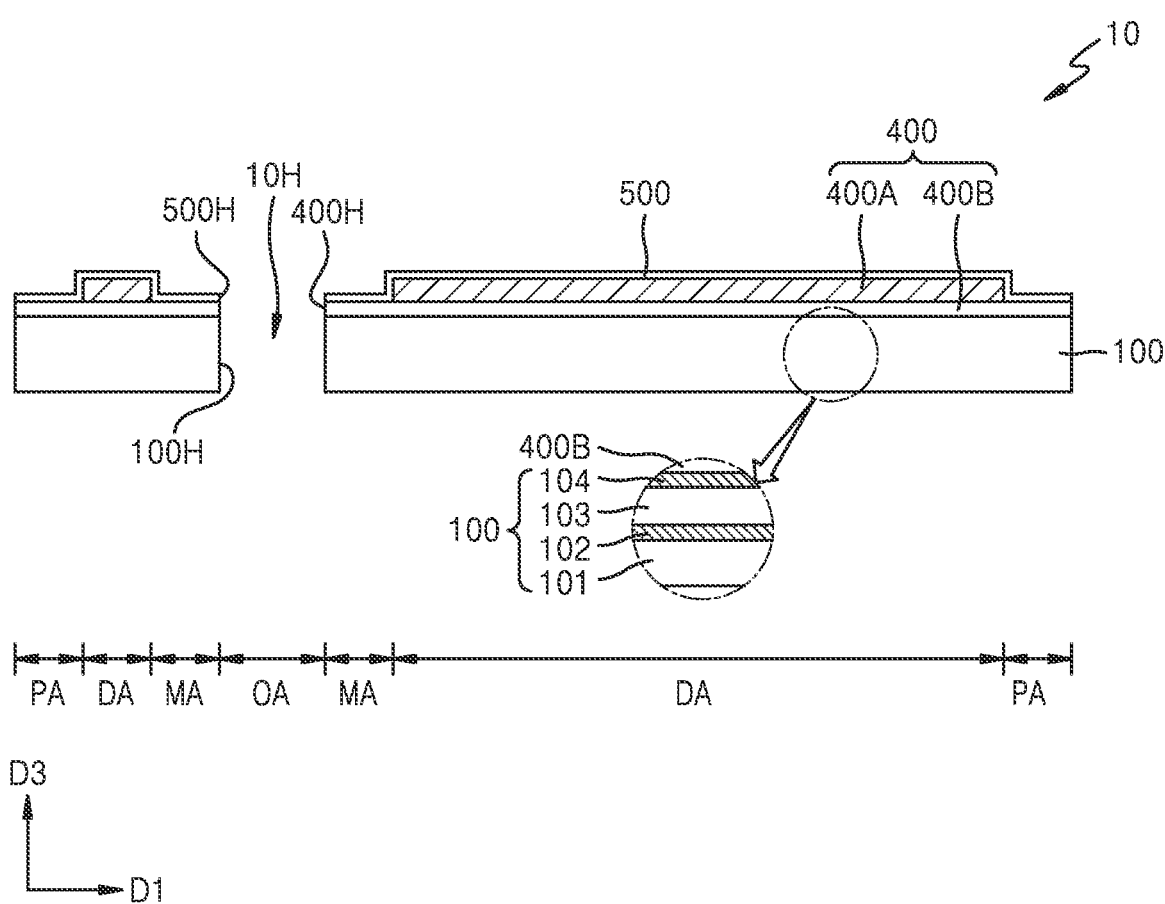
FIGS. 16A to 16D are schematic cross-sectional views of a display panel according to some example embodiments.

Referring to FIG. 16A, the display panel 10 may include a display layer 400 arranged on a substrate 100. The display layer 400 may include layers between the substrate 100 and a thin-film encapsulation layer 500.

The substrate 100 may include a glass material or a polymer resin. The substrate 100 may include various flexible or bendable materials. When the substrate 100 includes a polymer resin, the substrate 100 may include a multi-layer. For example, as shown in the enlarged view of FIG. 16A, the substrate 100 may include a first base layer 101, a first barrier layer 102, a second base layer 103, and a second barrier layer 104.

The first base layer 101 and the second base layer 103 each may include a polymer resin. For example, the first base layer 101 and the second base layer 103 may include a polymer resin such as PES, PAR, PEI, PEN, PET, PPS, PI, PC, cellulose triacetate (TAC), CAP, etc. The first base layer 101 and the second base layer 103 each may include a transparent polymer resin.

The first barrier layer 102 and the second barrier layer 104 are barrier layers that prevent penetration of external foreign substances and may include a single layer or a multi-layer including an inorganic material such as silicon nitride and silicon oxide.

The display layer 400 may include a plurality of pixels. The display layer 400 may include a display element layer 400A including display elements arranged for each pixel, and a pixel circuit layer 400B including a pixel circuit and insulating layers arranged for each pixel. Each pixel circuit may include a transistor and a storage capacitor, and each display element may include an organic light-emitting diode (OLED).

The display elements of the display layer 400 may be covered by an encapsulation member such as the thin-film encapsulation layer 500, and the thin-film encapsulation layer 500 may include at least one inorganic encapsulation layer and at least one organic encapsulation layer. When the display panel 10 includes a substrate 100 including a polymer resin, and a thin-film encapsulation layer 500 including an inorganic encapsulation layer and an organic encapsulation layer, flexibility of the display panel 10 may be improved.

The display panel 10 may include a first opening 10H penetrating the display panel 10. The first opening 10H may be located in the transmission area OA. FIG. 16A illustrates that the substrate 100 and the thin-film encapsulation layer 500 includes through holes 100H and 500H corresponding to the first opening 10H of the display panel 10, respectively. The display layer 400 may include a through hole 400H corresponding to the transmission area OA.

Figure 16B:
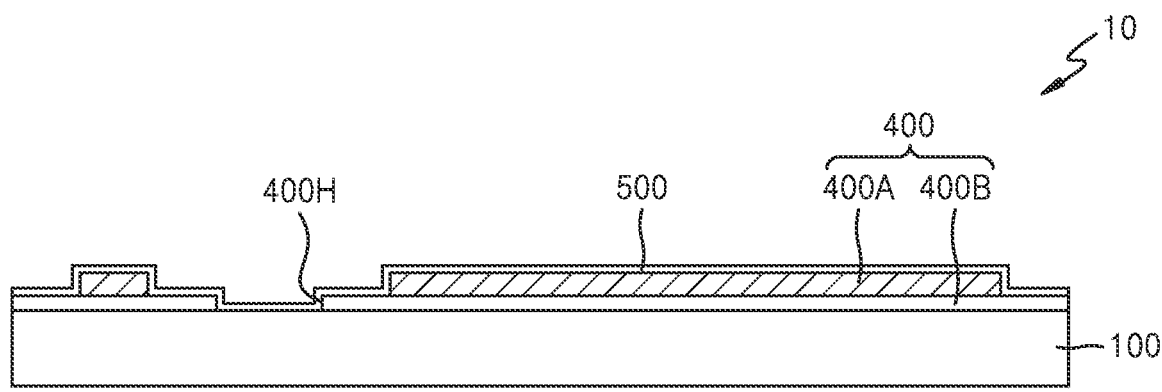

According to some example embodiments, the substrate 100 may not include a through hole corresponding to the transmission area OA as shown in FIG. 16B. The thin-film encapsulation layer 500 may not include the through hole corresponding to the transmission area OA. According to some example embodiments, as shown in FIG. 16C, the display layer 400 may not include the through hole 400H corresponding to the transmission area OA, and the display element layer 400A may not be located in the transmission area OA.

Figure 16C:
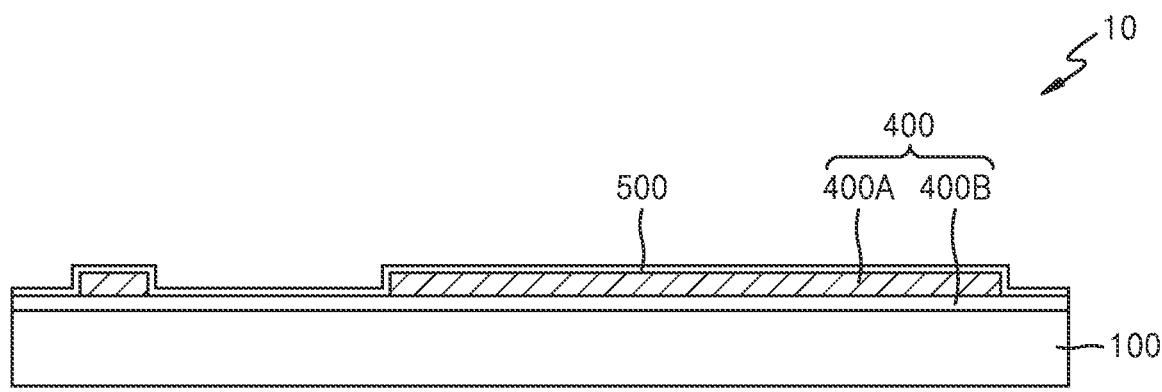
Figure 16C:
Figure 16C:
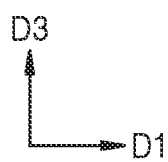
Figure 16D:
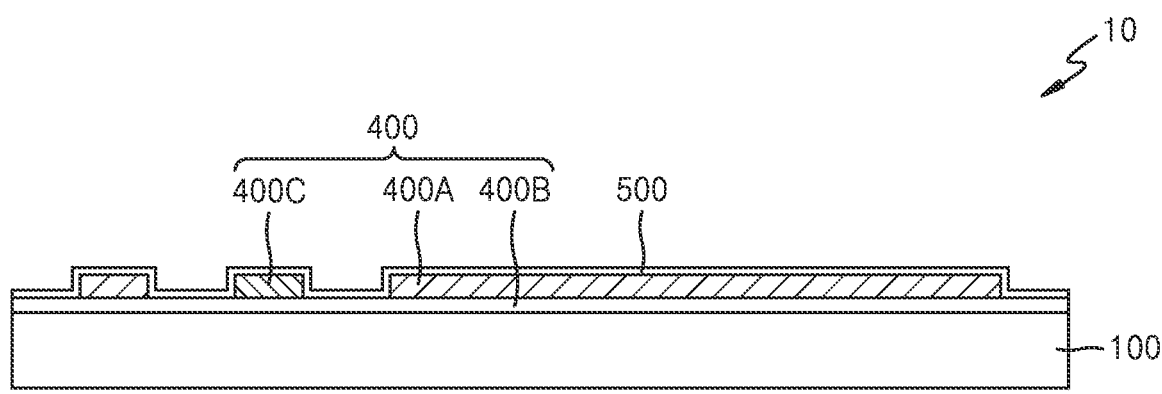

Though FIGS. 16A to 16C illustrate that the display element layer 400A is not arranged in the transmission area OA, the embodiments according to the present disclosure are not limited thereto. According to some example embodiments, as shown in FIG. 16D, an auxiliary display element layer 400C may be located in the transmission area OA. The auxiliary display element layer 400C may include a display element operating with a different structure and/or in a different method from the display element of the display element layer 400A.

According to some example embodiments, each pixel of the display element layer 400A may include an active organic light-emitting diode, and the auxiliary display element layer 400C may include pixels each including a passive organic light-emitting diode. When the auxiliary display element layer 400C includes a display element of the passive organic light-emitting diode, elements constituting a pixel circuit may not exist under the passive organic light-emitting diode. For example, a transistor and a storage capacitor are not included in a portion of the pixel circuit layer 400B under the auxiliary display element layer 400C.

According to some example embodiments, the auxiliary display element layer 400C may include a display element of the same type (e.g., an active organic light-emitting diode) as the display element layer 400A, but a pixel circuit thereunder may have a different structure. For example, the pixel circuit (e.g., a pixel circuit having a light-shielding layer between a substrate and a transistor, etc.) under the auxiliary display element layer 400C may have a different structure from the pixel circuit under the display element layer 400A. Alternatively, the display elements of the auxiliary display element layer 400C may operate according to a control signal different from a control signal by which the display elements of the display element layer 400A operate. A component (e.g., an infrared sensor, etc.) that does not require a relatively high transmittance may be arranged in the transmission area OA in which the auxiliary display element layer 400C is arranged. In this case, the transmission area OA may be understood as both a component area and an auxiliary display area.

FIGS. 17A to 17D are schematic cross-sectional views of a display panel 10' according to some example embodiments.

Unlike the display panel 10 described above with reference to FIGS. 16A to 16D having the thin-film encapsulation layer 500, the display panel 10' of FIGS. 17A to 17D may include an encapsulation substrate 500A and a sealant 540.

Figure 17A:
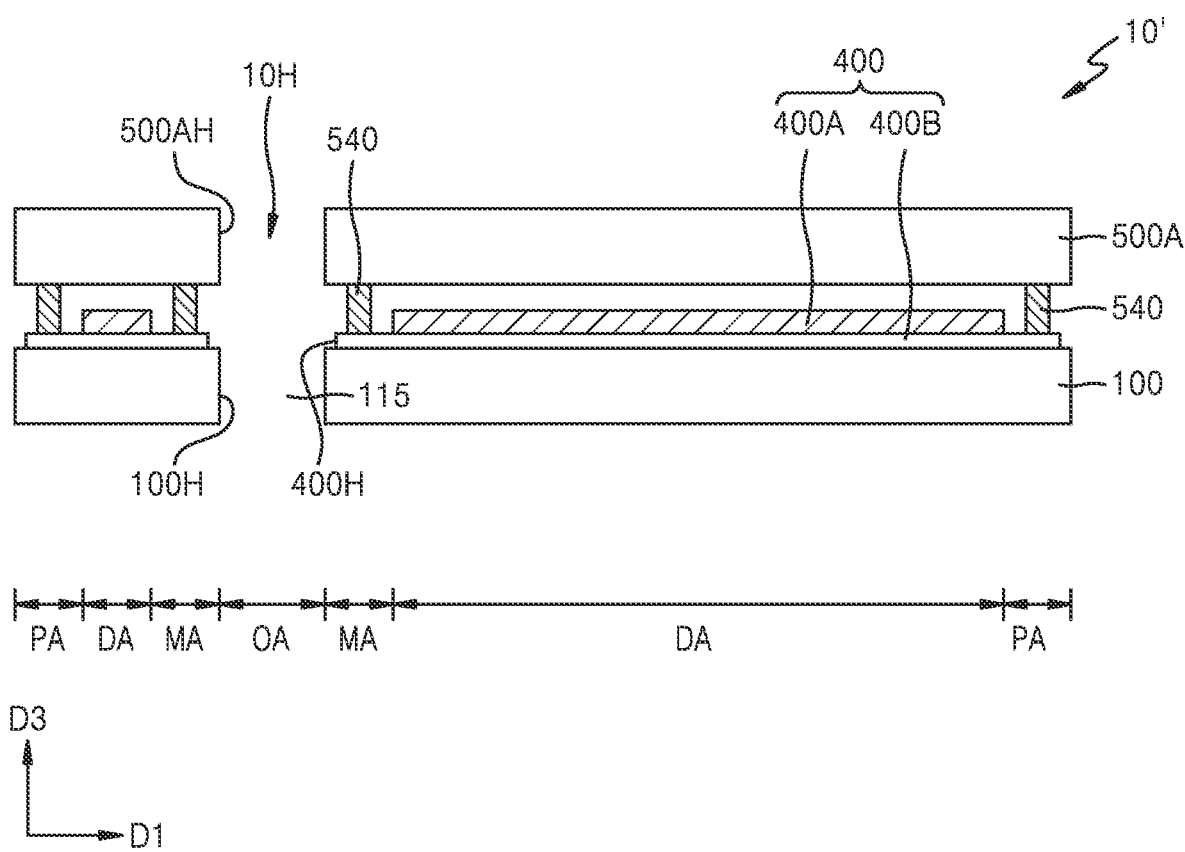
FIGS. 17A to 17D are schematic cross-sectional views of a display panel according to some example embodiments.
Figure 17B:
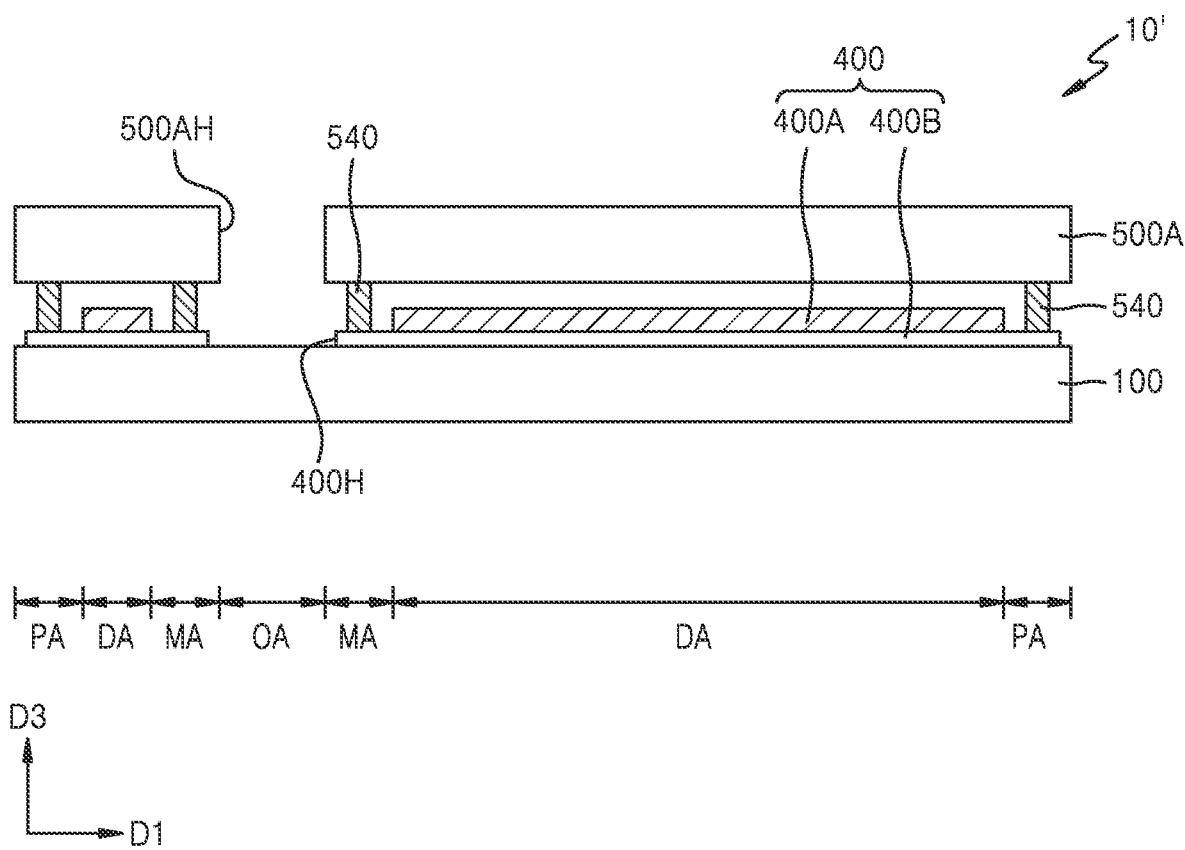
Figure 17C:
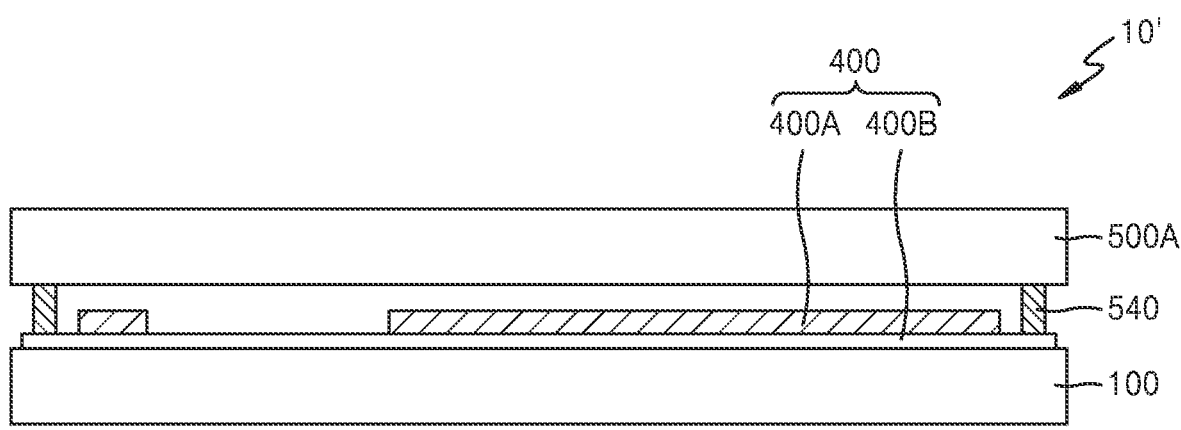
Figure 17C:
Figure 17C:
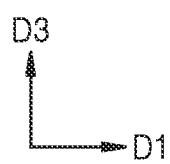
Figure 17D:
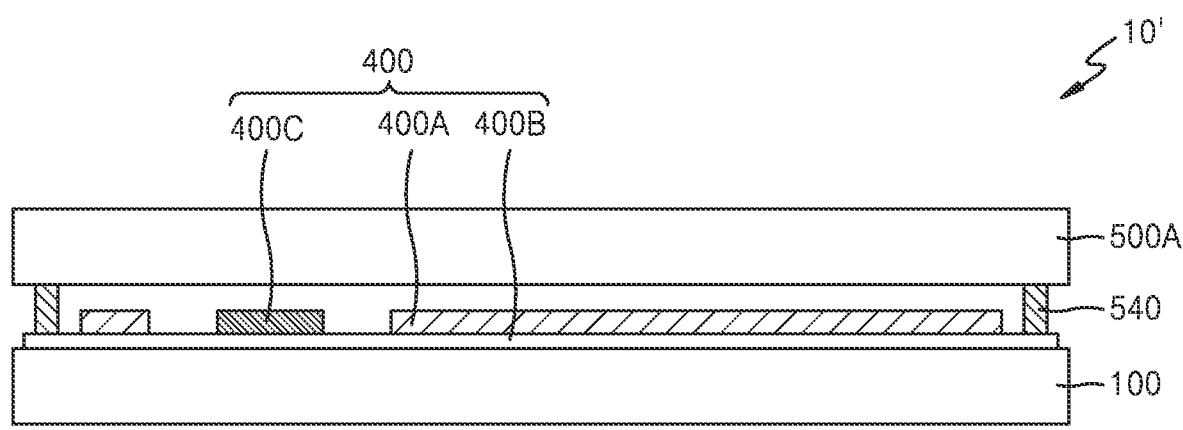

As shown in FIGS. 17A to 17C, one or more of the substrate 100, the display layer 400, and the encapsulation substrate 500A may include through holes 100H, 400H, and 500AH corresponding to the transmission area OA. The display element layer 400A may not be arranged in the transmission area OA, or the auxiliary display element layer 400C may be arranged in the transmission area OA as shown in FIG. 17D. The auxiliary display element layer 400C is as described above with reference to FIG. 16D.

The first connection lines 201 according to embodiments may have various shapes to minimize a wire resistor condenser without recognition of oblique spots due to coupling capacitance (parasitic capacitance) with the scan line SL. The first connection lines 201 each may have various shapes in which a portion extending in the first direction D1, a portion extending in the second direction D2, and a portion extending in a diagonal direction are mixed. The portions of the first connection lines 201 extending in the diagonal direction may have a zigzag shape (see FIG. 1, 12, or 13) in which a first sub-portion and a second sub-portion are repeated.

The structure of the first connection line 201 according to embodiments is not limited to the aforementioned display device and may be applied to display devices, in which an edge of a display area has at least one round corner, such as smartwatches or instrument panels for vehicles.

According to one or more embodiments, a display device, in which a dead area is reduced by connection lines in a display area and a data signal may be stably transmitted to pixels without an increase in manufacturing cost, may be provided. However, the scope of the embodiments is not limited to the above effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate including a display area, a peripheral area outside the display area, and a pad area in the peripheral area;
   a data line in the display area; and
   a first connection line in the display area and connected to the data line,
   wherein the first connection line has a serpentine shape, and
   wherein the first connection line includes a first portion arranged in a first direction and a second portion bent from the first portion, the first portion being on a different layer from at least one of the second portion or the data line.

2. The display device of claim 1, wherein the second portion extends in a second direction.

3. The display device of claim 1, wherein the first direction is parallel to a lengthwise direction of a scan line in the display area.

4. The display device of claim 1, wherein a second direction along which the second portion extends is parallel to a lengthwise direction of the data line.

5. The display device of claim 1, wherein the data line and the first portion are on different layers.

6. The display device of claim 1, wherein the first portion and the second portion are on different layers.

7. The display device of claim 1, wherein the first portion and the second portion are at a same layer.

8. The display device of claim 1, wherein at least one of the first portion or the second portion extends in a straight line.

9. The display device of claim 1, wherein at least a portion of the first connection line overlaps at least one of a scan line or a pixel electrode on a plane.

10. The display device of claim 1, further comprising a second connection line arranged in the peripheral area, connected to the first connection line, and located in the pad area.

11. The display device of claim 1, wherein the display area includes a plurality of pixel areas arranged in rows and columns, and
   one scan line passing through pixel areas in a same column among the plurality of pixel areas crosses the first connection line once or twice on a plane.

12. The display device of claim 1, wherein a distance from a portion of the first connection line, which is connected to the pad area, to the pad area is different from a distance from the pad area to a portion of the first connection line, which is connected to the data line.

13. The display device of claim 1, wherein a point of the first connection line, which has a maximum distance from the pad area to the first connection line, is between a portion of the first connection line, which is connected to the pad area, and a portion of the first connection line, which is connected to the data line.

14. The display device of claim 1, wherein the data line comprises a plurality of data lines spaced apart from each other in the display area,
   the first portion overlaps at least one of the plurality of data lines on a plane, and the first portion does not overlap a rest of the plurality of data lines except for the data lines overlapping on a plane.

15. The display device of claim 1, wherein a corner of an edge of the display area is round.

16. A display device comprising:
   a substrate including a display area, a peripheral area outside the display area, and a pad area in the peripheral area;
   a first data line in the display area; and
   a first connection line in the display area and connected to the first data line to transmit, to the first data line, a signal from the pad area,
   wherein the first connection line extends in a direction different from a longitudinal direction of the first data line, and
   wherein the first connection line includes a first portion arranged in a first direction and a second portion bent from the first portion, the first portion being on a different layer from at least one of the second portion or the first data line.

17. The display device of claim 16, wherein the first portion and the second portion are at different layers or at a same layer.

18. The display device of claim 16, further comprising a plurality of second data lines in the display area and each extending in a second direction,
   wherein at least one of the first data line or the second data line is at a different layer from at least one of the first portion or the second portion.

19. The display device of claim 16, further comprising: a plurality of second data lines in the display area and each extending in a second direction; and
   a third connection line in the peripheral area and having one end connected to one of the second data lines and an other end located in the pad area.

20. The display device of claim 16, wherein at least a portion of the first connection line overlaps at least one of a scan line or a pixel electrode on a plane.

21. The display device of claim 16, wherein a distance from a portion of the first connection line, which is connected to the pad area, to the pad area is different from a distance from the pad area to a portion of the first connection line, which is connected to the first data line.

22. The display device of claim 16, wherein a point of the first connection line, which has a maximum distance from the pad area to the first connection line, is between a portion of the first connection line, which is connected to the pad area, and a portion of the first connection line, which is connected to the first data line.

23. The display device of claim 1, wherein the substrate further includes a dummy area between the display area and the peripheral area.

* * * * *